United States Patent
Son et al.

(10) Patent No.: US 9,792,978 B2
(45) Date of Patent: Oct. 17, 2017

(54) SEMICONDUCTOR MEMORY DEVICE AND MEMORY SYSTEM INCLUDING THE SAME

(71) Applicant: Samsung Electronics Co., Ltd., Suwon-si (KR)

(72) Inventors: Jong-Pil Son, Seongnam-si (KR); Ho-Young Song, Hwaseong-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/341,245

(22) Filed: Nov. 2, 2016

(65) Prior Publication Data

US 2017/0148501 A1 May 25, 2017

(30) Foreign Application Priority Data

Nov. 25, 2015 (KR) .................. 10-2015-0165258

(51) Int. Cl.

| | |
|---|---|
| G11C 16/06 | (2006.01) |
| G11C 11/4093 | (2006.01) |
| G11C 11/4091 | (2006.01) |
| G11C 11/4096 | (2006.01) |
| G11C 11/406 | (2006.01) |
| G11C 11/408 | (2006.01) |
| G06F 3/06 | (2006.01) |

(52) U.S. Cl.
CPC .......... *G11C 11/4093* (2013.01); *G06F 3/061* (2013.01); *G06F 3/065* (2013.01); *G06F 3/0656* (2013.01); *G06F 3/0659* (2013.01); *G06F 3/0673* (2013.01); *G11C 11/4087* (2013.01); *G11C 11/4091* (2013.01); *G11C 11/4096* (2013.01); *G11C 11/40607* (2013.01)

(58) Field of Classification Search
CPC ...... G11C 16/06; G11C 11/4093; G06F 3/061
USPC ....................... 365/185.01–185.33
See application file for complete search history.

(56) References Cited

U.S. PATENT DOCUMENTS

| | | | |
|---|---|---|---|
| 5,737,573 A | 4/1998 | Funaki et al. | |
| 6,240,046 B1 * | 5/2001 | Proebsting | ............ G11C 7/065 257/E21.659 |
| 6,275,904 B1 | 8/2001 | Chennupaty et al. | |
| 8,190,794 B2 | 5/2012 | Badi et al. | |
| 8,719,516 B2 | 5/2014 | Walker et al. | |

(Continued)

FOREIGN PATENT DOCUMENTS

KR    2011-0004164 A    1/2011

*Primary Examiner* — Harry W Byrne
(74) *Attorney, Agent, or Firm* — Muir Patent Law, PLLC

(57) ABSTRACT

A semiconductor memory device includes a memory cell array and a first buffer. The memory cell array includes a plurality of bank arrays. Each of the plurality of bank arrays includes a plurality of memory cells. The memory cell array and the first buffer are configured for performing a first internal read operation, which represents operations of retrieving first data from a first region of the memory cell array and of storing the first data into the first buffer, based on a first read command and a first read address. The first internal read operation is performed based on a deterministic interface in which the first data is stored into the first buffer within a predetermined first duration after the first read command is received and a generation of a first acknowledgement signal is unnecessary after storing the first data into the first buffer is completed.

20 Claims, 21 Drawing Sheets

(56) References Cited

U.S. PATENT DOCUMENTS

| | | |
|---|---|---|
| 8,909,871 B2 | 12/2014 | Arimilli et al. |
| 2003/0086295 A1* | 5/2003 | Honda ............... G11C 8/12 365/185.13 |
| 2003/0188086 A1 | 10/2003 | Singh |
| 2006/0256616 A1* | 11/2006 | Honda ............... G11C 8/12 365/185.11 |
| 2010/0005199 A1 | 1/2010 | Gadgil |
| 2011/0007583 A1 | 1/2011 | Lee et al. |
| 2012/0134217 A1* | 5/2012 | Fujisawa ......... G11C 11/4087 365/189.05 |
| 2012/0246401 A1 | 9/2012 | Agam et al. |

* cited by examiner

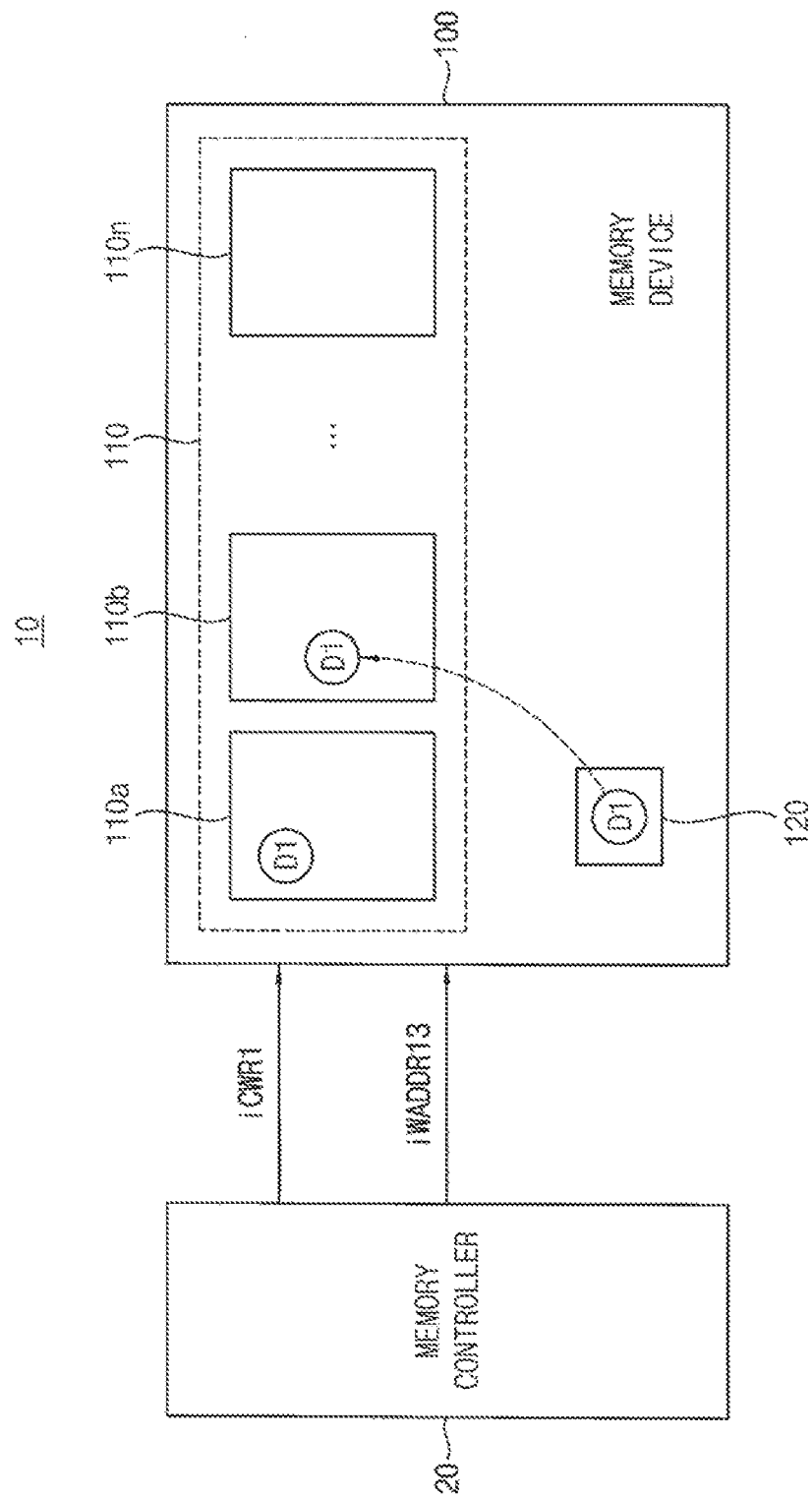

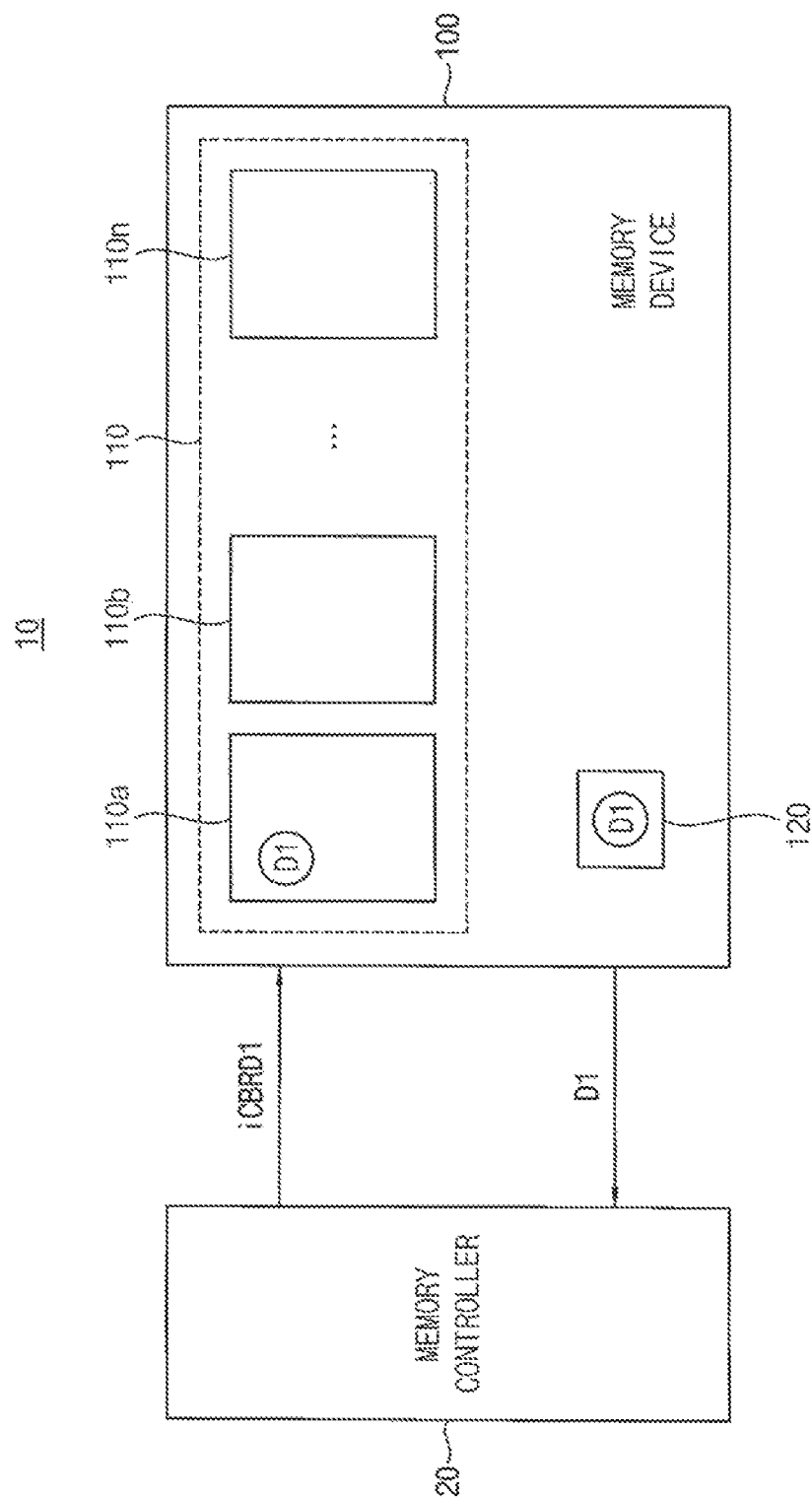

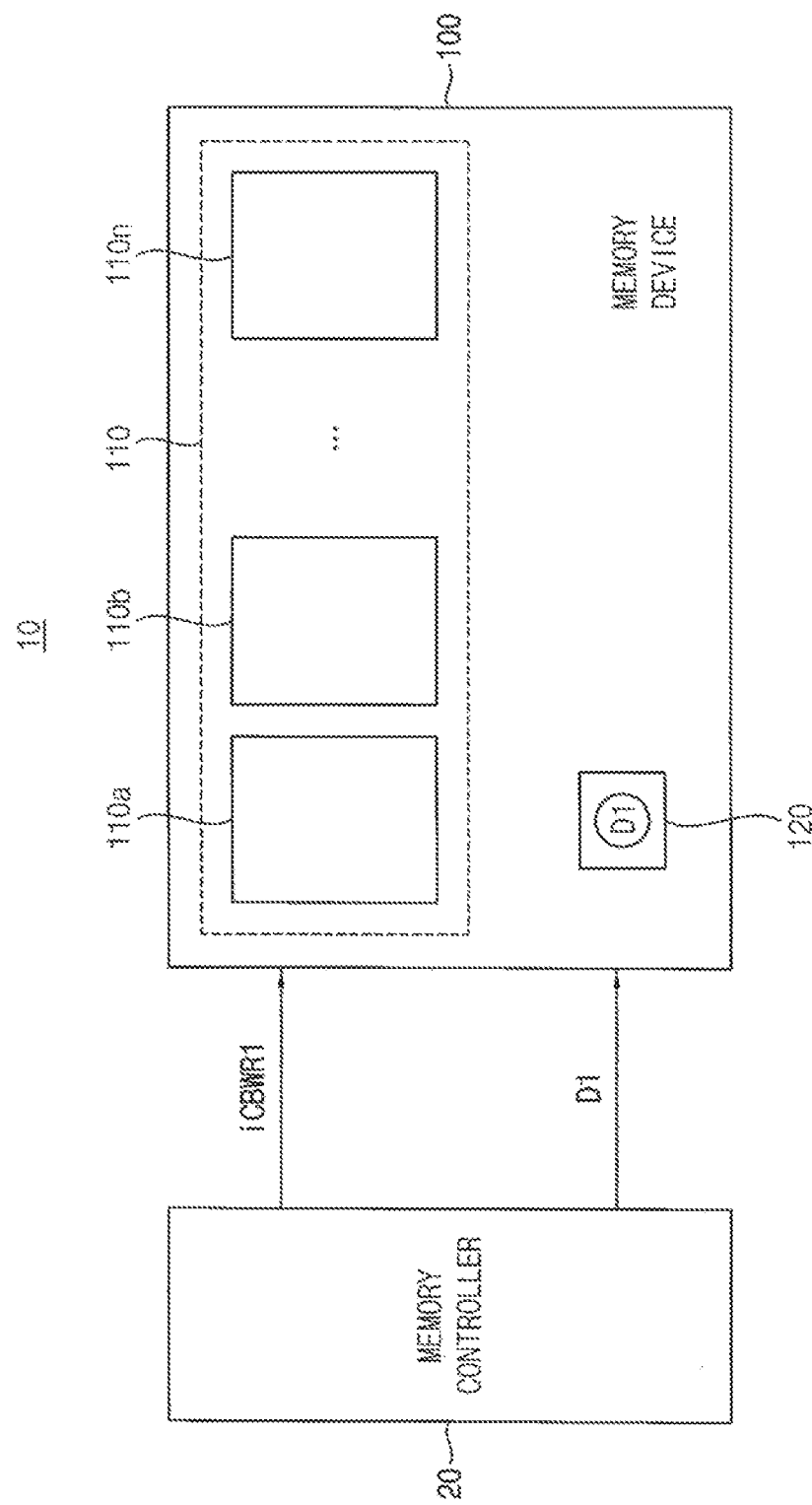

SEMICONDUCTOR MEMORY DEVICE AND MEMORY SYSTEM INCLUDING THE SAME

CROSS-REFERENCE TO RELATED APPLICATION

This application claims the benefit of priority under 35 U.S.C. §119 to Korean Patent Application No. 10-2015-0165258, filed on Nov. 25, 2015 in the Korean Intellectual Property Office (KIPO), the contents of which are herein incorporated by reference in their entirety.

BACKGROUND

1. Technical Field

Example embodiments relate generally to semiconductor devices, and more particularly to semiconductor memory devices and memory systems including the semiconductor memory devices.

2. Description of the Related Art

Semiconductor memory devices can be roughly divided into two categories depending upon whether they retain stored data when disconnected from power. These categories include volatile memory devices, which lose stored data when disconnected from power, and nonvolatile memory devices, which retain stored data when disconnected from power. These memory devices can perform write operations based on data received via data input/output (I/O) pins, and can output data obtained by read operations via the data I/O pins.

SUMMARY

In some embodiments, the disclosure is directed to a semiconductor memory device comprising: a memory cell array including a plurality of bank arrays, each of the plurality of bank arrays including a plurality of memory cells; and a first internal buffer, wherein the memory cell array and the first internal buffer are configured to perform a first internal read operation, including retrieving first data from a first region of the memory cell array and storing the first data into the first internal buffer based on a first read command and a first read address received by the semiconductor memory device, and wherein the first internal read operation is performed such that no acknowledgement signal is output from the semiconductor memory device in response to the first read command after the storing of the first data into the first internal buffer is completed, and wherein the first internal read operation is performed without outputting the first data from the semiconductor memory device.

In some embodiments, the disclosure is directed to a memory system comprising: a memory controller configured to generate a first read command and a first read address; and a semiconductor memory device controlled by the memory controller, the semiconductor memory device comprising: a memory cell array including a plurality of bank arrays, each of the plurality of bank arrays including a plurality of memory cells; and a first internal buffer, wherein the memory cell array and the first buffer are configured to perform a first internal read operation, including retrieving first data from a first region of the memory cell array and storing the first data into the first internal buffer, based on the first read command and the first read address, wherein the first internal read operation is performed such that no acknowledgement signal is output from the semiconductor memory device in response to the first read command after the storing the first data into the first buffer is completed, and wherein the first internal read operation is performed without outputting the first data from the semiconductor memory device.

In some embodiments, the disclosure is directed to a semiconductor memory device comprising: a memory cell array including a plurality of bank arrays, each of the plurality of bank arrays including a plurality of memory cells arranged in rows and columns; a first input/output buffer configured to receive input data from a memory controller external to the semiconductor memory device and output data to the memory controller; and a first internal buffer, wherein the semiconductor memory device is configured to receive a first command, a first address, a second command, and a second address, wherein the memory cell array and the first internal buffer are configured to perform a first internal read operation based on the first command and the first address received by the semiconductor memory device, including retrieving first data from a first region of the memory cell array and storing the first data into the first internal buffer, wherein the first data is not output from the semiconductor device in performing the first internal read operation, wherein the memory cell array and the first input/output buffer are configured to perform a second operation based on the second command and the second address received by the semiconductor memory device concurrently with performing the first internal read operation, and wherein the first internal read operation is performed no acknowledgement signal is output from the semiconductor memory device in response to the first read command after the storing of the first data into the first internal buffer is completed.

BRIEF DESCRIPTION OF THE DRAWINGS

Illustrative, non-limiting example embodiments will be more clearly understood from the following detailed description taken in conjunction with the accompanying drawings.

FIGS. 2, 3A, 3B, 3C, 4, 5, 6 and 7 are diagrams for describing operations of the exemplary memory system and the semiconductor memory device of FIG. 1.

DETAILED DESCRIPTION OF THE EMBODIMENTS

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

As used herein, a semiconductor device may refer to any of the various devices such as shown in the figures, and may also refer, for example, to two transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be include ball grid arrays, wire bonding, through substrate vias, or other electrical connection elements, and may include memory devices such as volatile or non-volatile memory devices. An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Figure 1:
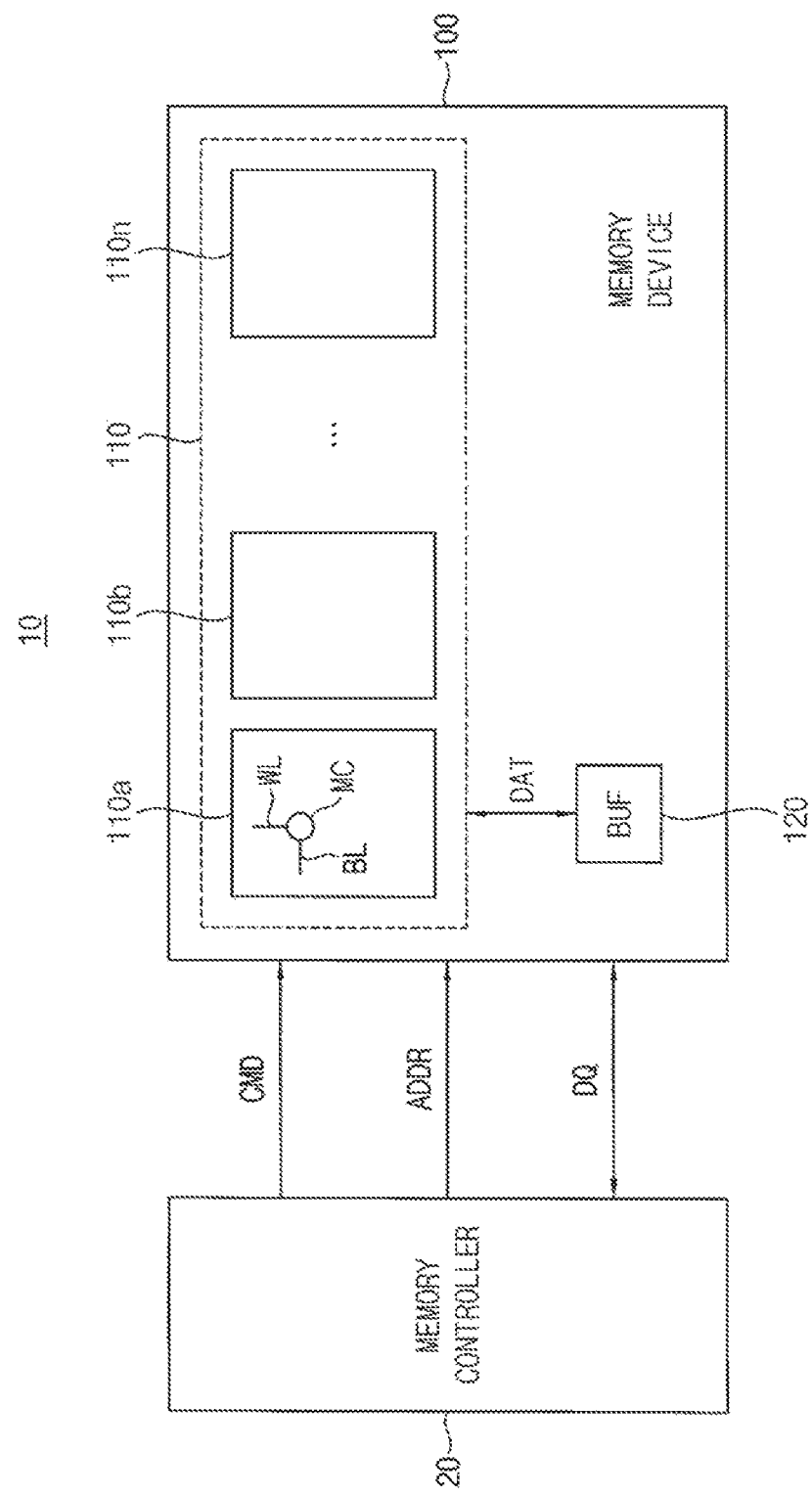
FIG. 1 is a block diagram illustrating a memory system including a semiconductor memory device according to example embodiments.

FIG. 1 is a block diagram illustrating a memory system including a semiconductor memory device according to example embodiments.

Referring to FIG. 1, a memory system 10 includes a memory controller 20 and a semiconductor memory device 100.

The semiconductor memory device 100 is controlled by the memory controller 20. For example, the memory controller 20 may transmit a command CMD and an address ADDR to the semiconductor memory device 100 over a bus (such as a shared command/address bus or a command bus separate from an address bus) connecting the memory controller 20 and semiconductor device 100. The memory controller 20 may exchange data with the semiconductor memory device 100 over a data bus connecting corresponding data terminals (e.g., pads or bumps) of the semiconductor memory device 10 and the memory controller 20 (referenced individually and collectively as DQ). It will be appreciated that other communication connections between the memory controller 20 and the semiconductor memory device 100 may be used, such as serial transfer of data, address and commands on one or more serial connections. The memory controller 20 may provide data (e.g., write data to be stored into the semiconductor memory device 100) to the semiconductor memory device 100 or may receive data (e.g., read data retrieved from the semiconductor memory device 100) from the semiconductor memory device 100 based on requests from a host (not illustrated).

The semiconductor memory device 100 includes a memory cell array 110 and a first buffer 120. Some elements of the semiconductor memory device 100 are omitted in FIG. 1 for convenience of illustration and will be described in detail with reference to FIG. 13.

The memory cell array 110 includes a plurality of bank arrays 110a, 110b, 110n. Each bank may be accessed (e.g., read, write or refresh operations) simultaneously with an access to another one or more of the banks. Each bank may have its own row decoder and/or column decoder. Each of the plurality of bank arrays 110a~110n includes a plurality of memory cells MC. Each of the plurality of memory cells MC may be connected to a respective one wordline WL and a respective one bitline BL. The memory cell array such that data may be written to a selected part of the memory cell array to overwrite stored data in the selected part of the memory cell array in the same write operation (e.g., without first requiring an erase operation of the selected part of the memory cell array). The memory cell array 110 may be a random access memory cell array, such as a dynamic random access array. In some embodiments, each memory cell MC may be composed of a single transistor and a capacitor, with a gate of the transistor connected to a corresponding wordline WL, a first source/drain of the memory cell transistor connected to a corresponding bitline BL and a second source/drain of the memory cell transistor connected to an electrode of the capacitor of the memory cell MC.

The first buffer 120 exchanges data DAT with the memory cell array 110. For example, based on requests from the memory controller 20 and/or the host, data that is retrieved (e.g., read or obtained) from the memory cell array 110 may be temporarily stored into the first buffer 120, and/or the data that is temporarily stored in the first buffer 120 may be provided to and stored (e.g., written or saved) into the memory cell array 110. In the memory system 10, an operation where the data DAT is not output to or received from an external device (e.g., the memory controller 20) and is exchanged between the memory cell array 110 and the first buffer 120 may be referred to as an internal read operation or an internal write operation.

The semiconductor memory device 100 may operate based on a deterministic interface. In the deterministic interface, the data DAT (e.g., the write data or the read data) may be provided to or output from the memory cell array 110 within a predetermined first duration after commands CMD (e.g., a write command or a read command) are generated or received. For example, the semiconductor memory device 100 may include any volatile memory device, e.g., a dynamic random access memory (DRAM), and the deterministic interface may correspond to a DRAM interface. For example, the semiconductor memory device 100 may communicate directly with the memory controller 20 to have a direct interface with the memory controller 20. In one embodiment, commands, address information, and data may be transmitted from the memory controller 20 to the semiconductor memory device 100, and the semiconductor memory device 100 may be accessed by directly using those commands, addresses, and data, with respect to each other. For example, when a write command CMD is received by the semiconductor memory device 100, the semiconductor memory device 100 may write data received on data bus DQ to a memory location identified by address ADDR. The commands may be a certain type of access command. For example, if the semiconductor memory device 100 is a DRAM, then standard DRAM signals including DRAM-type commands may be sent from the memory controller 20 to the semiconductor memory device 100. In some embodiments, semiconductor memory device 100 may be a graphics memory and may be used as a memory in a massively parallel processor. For example, semiconductor memory device 100 may be used as a global memory for graphics-related tasks, such as, for example, texture memory, etc.

The semiconductor memory device 100 according to example embodiments may include the first buffer 120 that is different and separated from a data input/output (I/O) buffer. The semiconductor memory device 100 may perform at least one of the internal read operation and the internal write operation based on the first buffer 120, and thus the semiconductor memory device 100 may efficiently copy data stored in a first region of the memory cell array 110 to a second region of the memory cell array 110. For example, the semiconductor memory device 100 may copy data from the first region to the second region of the memory cell array 110 without transmitting the data outside of the semiconductor device 110 (such as to the memory controller 20). For example, the semiconductor memory device 100 may copy data from the first region to the second region of the memory cell array 110 without transmitting data to its data terminals DQ (or to the data bus connected to the data terminals DQ). Accordingly, the semiconductor memory device 100 and the memory system 10 may operate with relatively low power consumption, improved bus efficiency and enhanced performance.

Hereinafter, operations of the semiconductor memory device 100 that are associated with the first buffer 120 will be described in detail.

FIGS. 2, 3A, 3B, 3C, 4, 5, 6 and 7 are diagrams for describing operations of the memory system and the semiconductor memory device of FIG. 1.

Figure 2:
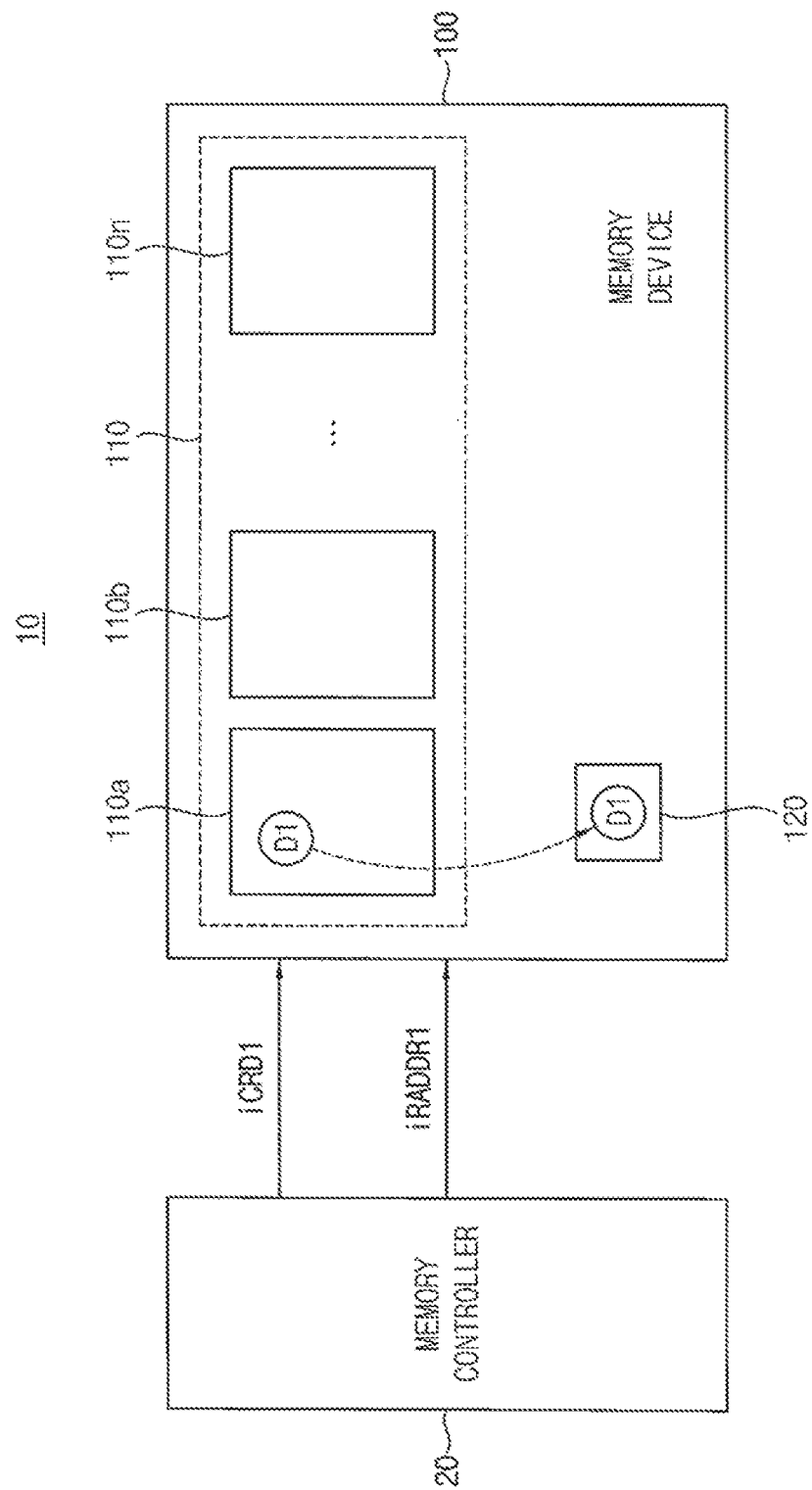

Referring to FIG. 2, the memory controller 20 generates a first read command iCRD1 and a first read address iRADDR1 and provides the first read command iCRD1 and the first read address iRADDR1 to the semiconductor memory device 100.

The first read command iCRD1 may be a command for performing the internal read operation. When a normal read operation is performed based on a normal read command, read data (e.g., data retrieved from the memory cell array 110) may be output to the external device (e.g., the memory controller 20) via the data I/O buffer and a data I/O pin. When the internal read operation is performed based on the first read command iCRD1 that is different from the normal read command, the read data may not be output to the external device and may be stored into the first buffer 120 that is disposed inside the semiconductor memory device 100. As used herein, the term "normal" (e.g., "normal read," "normal write," etc.) is used as an aid in distinguishing between the disclosed "internal" read/write commands/operations (e.g., commands/operations corresponding to an internal data transfer between memory locations within the semiconductor device 100, and/or where data is not input to and/or output from the semiconductor memory device 100) and other read/write commands/operations (e.g., commands/operations causing data to be input to and/or output from the semiconductor memory device 100).

The first read address iRADDR1 may identify a first read region of the memory cell array 110 in which first data D1 to be read is stored. In this example, the first read region is arranged in a first row of the first bank array 110a among the plurality of bank arrays 110a~110n.

The semiconductor memory device 100 receives the first internal read command iCRD1 and the first read address iRADDR1. Based on the first internal read command iCRD1 and the first read address iRADDR1, the first data D1 is retrieved from the first read region, and then the retrieved first data D1 is stored into the first buffer 120.

A first internal read operation, which represents sequential operations of retrieving the first data D1 from the first read region and of storing the first data D1 into the first buffer 120, is performed based on the deterministic interface. For example, in the deterministic interface, the first data D1 is output from the first read region and is stored into the first buffer 120 within the predetermined first duration or period of time after the first read command iCRD1 is received at the semiconductor memory device 100. In addition, in the deterministic interface, a generation of a first acknowledgement signal is unnecessary after storing the first data D1 into the first buffer 120 is completed.

A size of the first data D1 may be substantially the same as a storage capacity of the first buffer 120. In some embodiments, the storage capacity of the first buffer 120 may be substantially the same as a unit of which the semiconductor memory device 100 performs a read operation (e.g., the normal read operation and/or the internal read operation). For example, when the semiconductor memory device 100 performs the read operation in units of about 32 bytes, the size of the first data D1 may be about 32 bytes, and the storage capacity of the first buffer 120 may also be about 32 bytes.

In some example embodiments, an operation speed of the first buffer 120 may be faster than an operation speed of the memory cell array 110. For example, the first buffer 120 may be a register comprising static random access memory (SRAM) that has an access speed (e.g., read speed and/or write speed) higher than the memory cell array 110. An internal bus (not shown in FIG. 2) may connect the buffer 120 to the banks of the memory cell array 110 to transfer data between the banks and the memory buffer 120. The data may be transferred sequentially on the internal bus and the bus width (number of data lines) may be smaller than the size of the first data D1. Data may be transferred between a bank of the memory cell array 110 by selectively retrieving from/storing data in portions of a buffer (such as a sense amplifier array) dedicated to the bank (e.g., not shared with other banks) identified by corresponding column addresses.

Figure 3A:
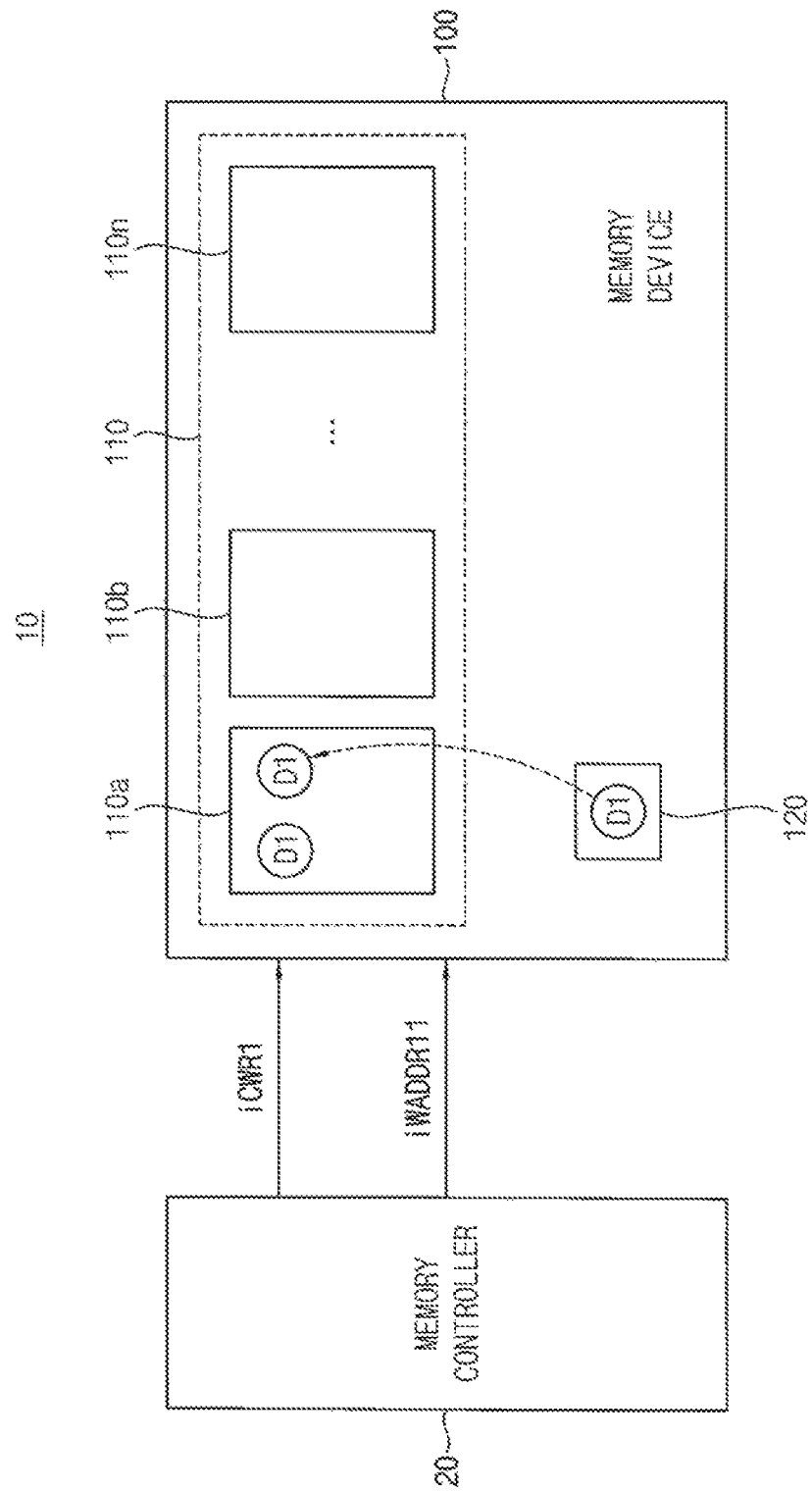

Referring to FIGS. 2 and 3A, after the first internal read operation of FIG. 2, the memory controller 20 may generate a first write command iCWR1 and a first write address iWADDR11 and may provide the first write command iCWR1 and the first write address iWADDR11 to the semiconductor memory device 100.

The first write command iCWR1 may be a command for performing the internal write operation. When a normal write operation is performed based on a normal write command, write data (e.g., data to be written into the memory cell array 110) may be received from the external device (e.g., the memory controller 20) via the data I/O buffer and the data I/O pin. When the internal write operation is performed based on the first write command iCWR1 that is different from the normal write command, the write data may not be received from the external device and may be provided from the first buffer 120.

The first write address iWADDR11 may identify a first write region of the memory cell array 110 in which the first data D1 is to be written. The first write region may be different from the first read region. In this example, the first write region also may be arranged in the first row of the first bank array 110a. In the example of FIG. 3A, the first read region and the first write region may be arranged in the same row of the same bank array and may be identified by the same row address and bank address.

The semiconductor memory device 100 may receive the first write command iCWR1 and the first write address iWADDR11. Based on the first write command iCWR1 and the first write address iWADDR11, the first data D1 may be retrieved from the first buffer 120, and then the retrieved first data D1 may be stored into the first write region.

A first internal write operation, which represents sequential operations of retrieving the first data D1 from the first buffer 120 and of storing the first data D1 into the first write region, may be performed based on the deterministic interface. For example, in the deterministic interface, the first data D1 may be read or output from the first buffer 120 and may be stored into the first write region within the first duration after the first write command iCWR1 is received at the semiconductor memory device 100. In addition, in the deterministic interface, a generation of a second acknowledgement signal may be unnecessary after storing the first data D1 into the first write region is completed. It will be appreciated that, in the deterministic interface described herein, the first duration associated with the internal read operation and the first duration associated with the internal write operation may be the same duration or a different duration.

Figure 3B:
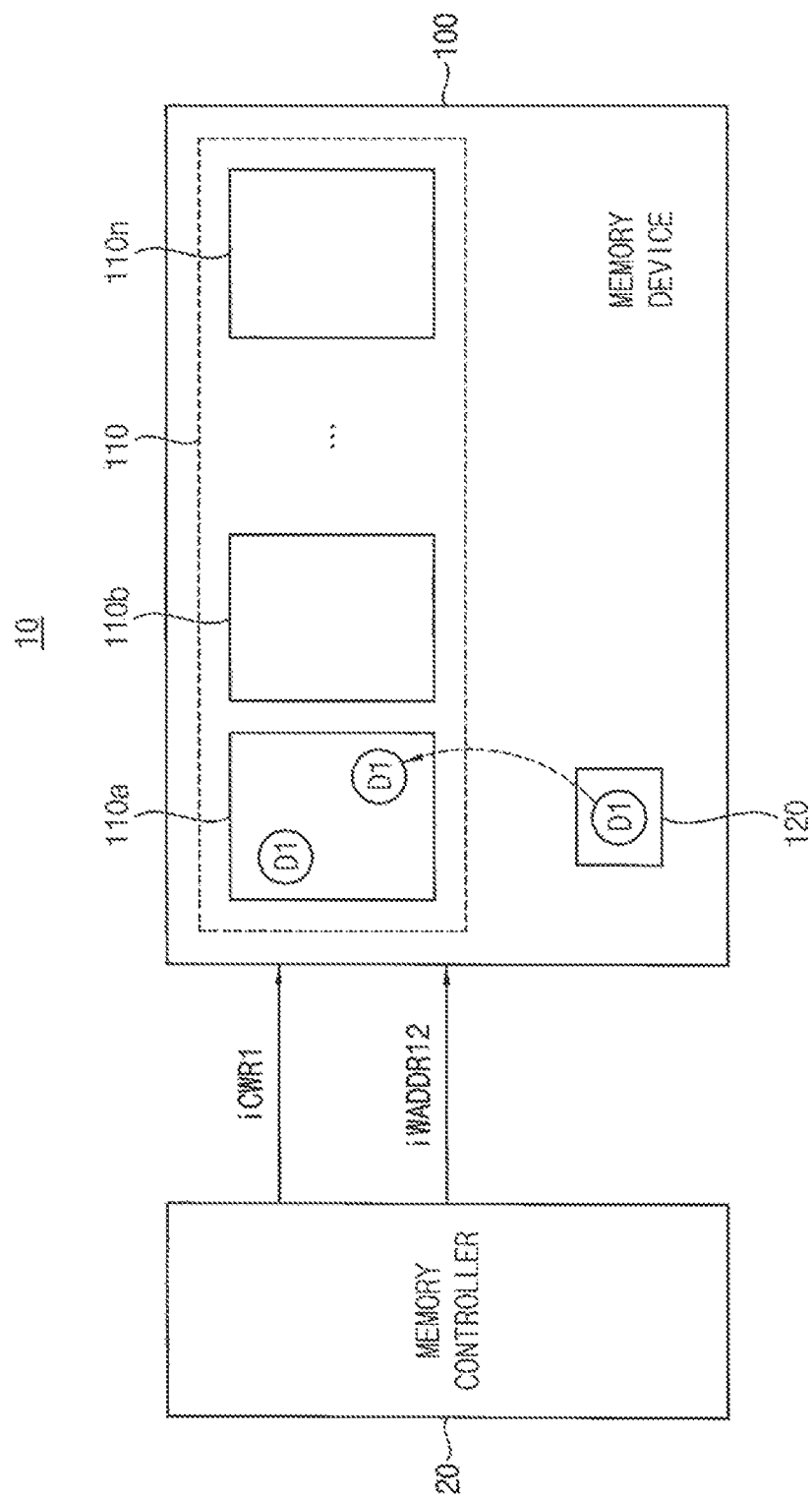

Referring to FIGS. 2 and 3B, after the first internal read operation of FIG. 2, the memory controller 20 may generate the first write command iCWR1 and a second write address iWADDR12 and may provide the first write command iCWR1 and the second write address iWADDR12 to the semiconductor memory device 100.

The first write command iCWR1 may be a command for performing the internal write operation. The second write address iWADDR12 may indicate a second write region of the memory cell array 110 in which the first data D1 is to be written. The second write region may be different from the first read region. In this example, the second write region may be arranged in a second row of the first bank array 110a different from the first row of the first bank array 110a. In the example of FIG. 3B, the first read region and the second write region may be arranged in different rows (identified by different row addresses) of the same bank array (identified by the same bank address).

The internal write operation based on the first write command iCWR1 and the second write address iWADDR12 may be substantially the same as the first internal write operation described with reference to FIG. 3A.

Referring to FIGS. 2 and 3C, after the first internal read operation of FIG. 2, the memory controller 20 may generate the first write command iCWR1 and a third write address iWADDR13 and may provide the first write command iCWR1 and the third write address iWADDR13 to the semiconductor memory device 100.

The first write command iCWR1 may be a command for performing the internal write operation. The third write address iWADDR13 may indicate a third write region of the memory cell array 110 in which the first data D1 is to be written. The third write region may be different from the first read region. For example, the third write region may be arranged in the second bank array 110b different from the first bank array 110a. In the example of FIG. 3C, the first read region and the third write region may be arranged in different bank arrays (identified by different bank addresses). A row of the first bank array 110a in which the first read region is arranged may be substantially the same as or different from a row of the second bank array 110b in which the third write region is arranged.

The internal write operation based on the first write command iCWR1 and the third write address iWADDR13 may be substantially the same as the first internal write operation described with reference to FIG. 3A. The first write command iCWR1 may be repetitively issued after the first internal read operation to write the read data in buffer 120 in multiple write regions (e.g., first, second and/or third write regions) of the memory cell array 110.

As described above with reference to FIGS. 2, 3A, 3B and 3C, when the first internal read operation and the first internal write operation are sequentially performed, the first data D1 that is stored in the first read region of the memory cell array 110 may be copied to another region (e.g., one or more of the first, second and third write regions) of the memory cell array 110. As noted, the first and second acknowledgement signals may not be implemented (although it may be desired in some circumstances). In addition, generation of a third acknowledgement signal may also be unnecessary after copying the first data D1 in the first read region to the another region is completed (e.g., after the copy operation).

In some example embodiments, the purpose of the first data D1 stored in the first read region may be different from the purpose of the first data D1 stored in one of the first, second and third write regions. For example, the first data D1 stored in the first read region may be used by a first external processor (e.g., a graphic processing unit (GPU)), and the first data D1 stored in one of the write regions may be used by a second external processor (e.g., a central processing unit (CPU)) that is different from the first external processor.

The semiconductor memory device 100 according to example embodiments may efficiently perform the copy operation based on the internal read operation and the internal write operation, without outputting/receiving data to/from the external device. Accordingly, the semiconductor memory device 100 may operate with relatively low power consumption.

Referring to FIGS. 2 and 4, after the first internal read operation of FIG. 2, the memory controller 20 may generate a read command iCBRD1 and may provide the read command iCBRD1 to the semiconductor memory device 100.

The read command iCBRD1 may be a command for performing a buffer read operation in which the first data D1 stored in the first buffer 120 is output to the external device (e.g., the memory controller 20). The read command iCBRD1 may be different from the normal read command for the normal read operation and the first read command (e.g., iCRD1 in FIG. 2) for the internal read operation (e.g., these read commands may be represented by different codes (e.g., bit combinations) representing different commands).

In some example embodiments, the read command iCBRD1 may be provided without any address. For example, when the buffer read operation is to be performed, the memory controller 20 may only generate the read command iCBRD1 and may not generate any address for the buffer read operation.

The semiconductor memory device 100 may receive the read command iCBRD1. Based on the read command iCBRD1, the first data D1 may be retrieved from the first buffer 120, and then the retrieved first data D1 may be output to the memory controller 20 via the data I/O buffer and the data I/O pin(s). In some embodiments, all the data stored in the first buffer 120 may be retrieved from the first buffer 120, stored in the data I/O buffer (not shown), and output to the memory controller 20 via the data I/O pin(s).

Referring to FIG. 5, the memory controller 20 may generate a write command iCBWR1 and the first data D1, and may provide the write command iCBWR1 and the first data D1 to the semiconductor memory device 100.

The write command iCBWR1 may be a command for performing a buffer write operation in which the first data D1 received from the external device (e.g., the memory controller 20) is stored into the first buffer 120. The write command iCBWR1 may be different from the normal write command for the normal write operation and the first write command (e.g., iCWR1 in FIG. 3A) for the internal write operation.

In some example embodiments, the write command iCBWR1 may be provided without any address. For example, when the buffer write operation is to be performed, the memory controller 20 may only generate the write command iCBWR1 and may not generate any address for the buffer write operation.

The semiconductor memory device 100 may receive the write command iCBWR1 and the first data D1. Based on the write command iCBWR1, the first data D1 may be received from the memory controller 20 via the data I/O buffer and the data I/O pin, and then the received first data D1 may be stored into the first buffer 120. In some embodiments, the storage capacity of the first buffer 120 may be substantially the same as a unit of the first data D1 received from the memory controller 20. For example, when the memory controller 10 transmits 32 bytes of first data D1, and the storage capacity of the first buffer 120 may also be about 32 bytes.

In some example embodiments, after the buffer write operation of FIG. 5, the internal write operation described with reference to FIGS. 3A, 3B and 3C may be performed.

In some example embodiments, each of the buffer read operation of FIG. 4 and the buffer write operation of FIG. 5 may be performed based on the deterministic interface.

Figure 6:
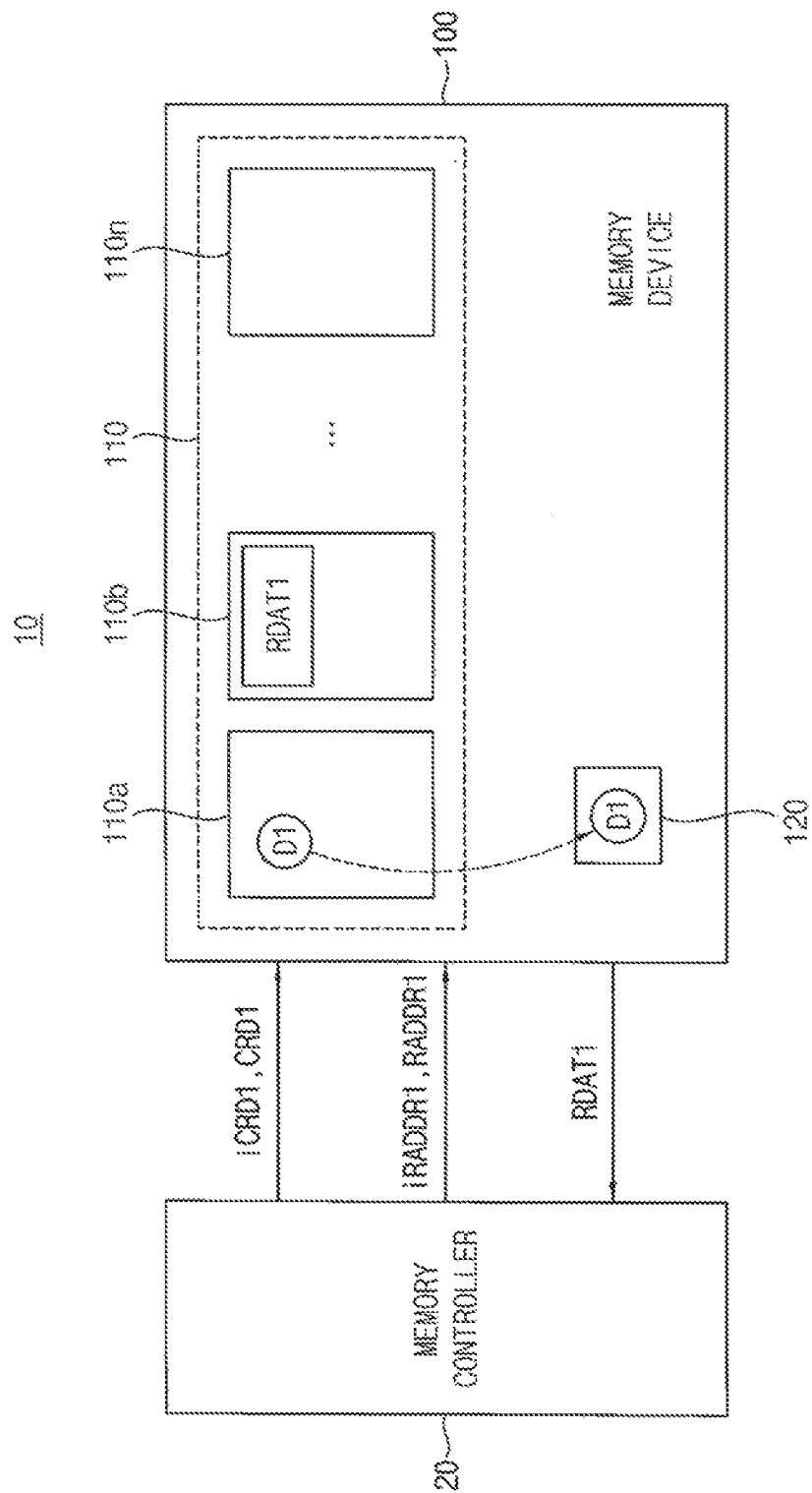

Referring to FIG. 6, the memory controller 20 may generate the first read command iCRD1, the first read address iRADDR1, a second read command CRD1 and a second read address RADDR1, and may provide the first read command iCRD1, the first read address iRADDR1, the second read command CRD1 and the second read address RADDR1 to the semiconductor memory device 100.

The first read command iCRD1 and the first read address iRADDR1 in FIG. 6 may be substantially the same as the respective first read command iCRD1 and the first read address iRADDR1 in FIG. 2. The second read command CRD1, which is different from the first read command iCRD1, may be a command for performing the normal read operation. The second read address RADDR1 may indicate a region of the memory cell array 110 (e.g., a region of the second bank array 110b) in which is stored data RDAT1 that is to be read.

The semiconductor memory device 100 may receive the first read command iCRD1, the first read address iRADDR1, the second read command CRD1 and the second read address RADDR1.

The semiconductor memory device 100 may substantially simultaneously (or concurrently) perform the first internal read operation and the first normal read operation. For example, based on the first read command iCRD1 and the first read address iRADDR1, the first data D1 may be retrieved from the first read region, and then the retrieved first data D1 may be stored into the first buffer 120. While the first internal read operation is performed, based on the second read command CRD1 and the second read address RADDR1, the data RDAT1 may be retrieved from the second bank array 110b, and the retrieved data RDAT1 may be output to the external device (e.g., the memory controller 20) via an input/output buffer (not shown). For example, the data RDAT1 may be retrieved from the second bank array 110b, stored in the input/output buffer, and output to the memory controller 20 via data I/O pins.

Figure 7:
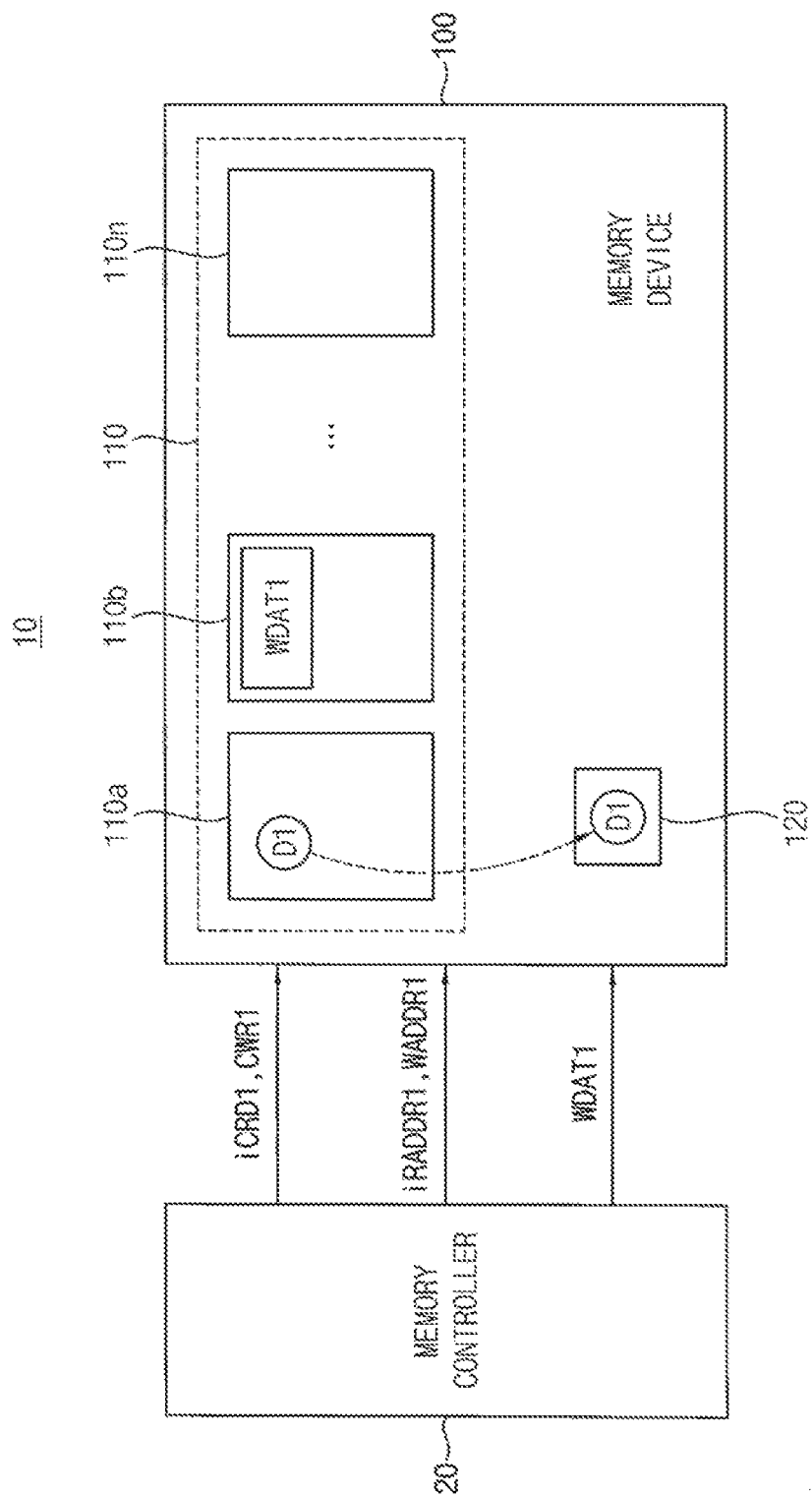

Referring to FIG. 7, the memory controller 20 may generate the first read command iCRD1, the first read address iRADDR1, a first write command CWR1, a first write address WADDR1 and data WDAT1, and may provide the first read command iCRD1, the first read address iRADDR1, the first write command CWR1, the first write address WADDR1 and the data WDAT1 to the semiconductor memory device 100.

The first read command iCRD1 and the first read address iRADDR1 in FIG. 7 may be substantially the same as the respective first read command iCRD1 and the first read address iRADDR1 in FIG. 2. The first write command CWR1, which is different from the first write command iCWR1 in FIG. 3A, may be a command for performing the normal write operation. The first write address WADDR1 may indicate a region of the memory cell array 110 (e.g., a region of the second bank array 110b) in which the data WDAT1 is to be written.

The semiconductor memory device 100 may receive the first read command iCRD1, the first read address iRADDR1, the first write command CWR1, the first write address WADDR1 and the data WDAT1.

The semiconductor memory device 100 may substantially simultaneously (or concurrently) perform the first internal read operation and a first normal write operation. For example, based on the first read command iCRD1 and the first read address iRADDR1, the first data D1 may be retrieved from the first read region, and then the retrieved first data D1 may be stored into the first buffer 120. While the first internal read operation is performed, based on the first write command CWR1 and the first write address WADDR1, the data WDAT1 may be received from the external device (e.g., the memory controller 20) and the received data WDAT1 may be stored into the second bank array 110b.

The semiconductor memory device 100 according to example embodiments may substantially simultaneously (or concurrently) perform the internal read operation and one of the normal read operation and the normal write operation. For example, the semiconductor memory device 100 may perform the internal read operation while performing the normal read operation or the normal write operation. Accordingly, the semiconductor memory device 100 may operate with relatively low power consumption, improved bus efficiency and enhanced performance.

Similarly, although not illustrated in FIGS. 6 and 7, the semiconductor memory device 100 may substantially simultaneously (or concurrently) perform the internal write operation and one of the normal read operation and the normal write operation.

The memory system 10 and/or the semiconductor memory device 100 may comprise a command decoder that receives the external commands and can distinguish between the different external commands, such as, a command for the internal read operation (e.g., iCRD1 in FIG. 2), a command for the buffer read operation (e.g., iCBRD1 in FIG. 4), and a command for the normal read operation (e.g., CRD1 in FIG. 6). For example, iCRD1 in FIG. 2, iCBRD1 in FIG. 4, and CRD1 in FIG. 6 may be distinguished based on at least one flag bit, and then such distinguishing may be performed by a command decoder (e.g., an element 211 in FIG. 13). Similarly, the memory system 10 and/or the semiconductor memory device 100 may include an element that can distinguish between a command for the internal write operation (e.g., iCWR1 in FIG. 3A), a command for the buffer read operation (e.g., iCBWR1 in FIG. 5), and a command for the normal read operation (e.g., CWR1 in FIG. 7).

Figure 8:
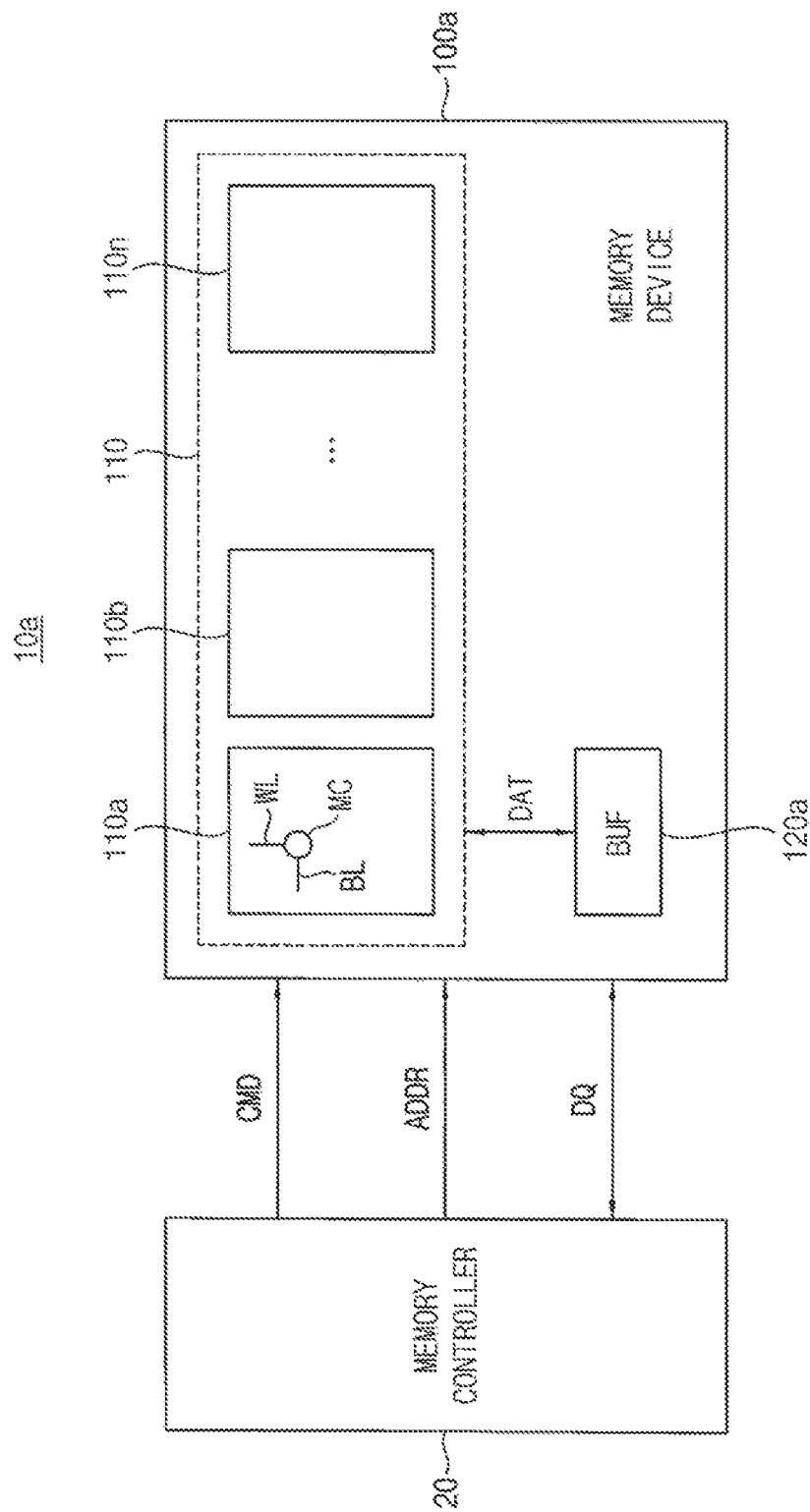
FIG. 8 is a block diagram illustrating a memory system including a semiconductor memory device according to example embodiments.

FIG. 8 is a block diagram illustrating a memory system including a semiconductor memory device according to example embodiments.

Referring to FIG. 8, a memory system 10a includes a memory controller 20 and a semiconductor memory device 100a. The semiconductor memory device 100a includes a memory cell array 110 and a first buffer 120a. As shown in FIG. 8, each memory cell MC may be connected to one word line WL and one bit line BL.

The semiconductor memory device 100a in FIG. 8 may be substantially the same as the semiconductor memory device 100 in FIG. 1, except that a storage capacity of the first buffer 120a in FIG. 8 may be different from the storage capacity of the first buffer 120 in FIG. 1.

Figure 9:
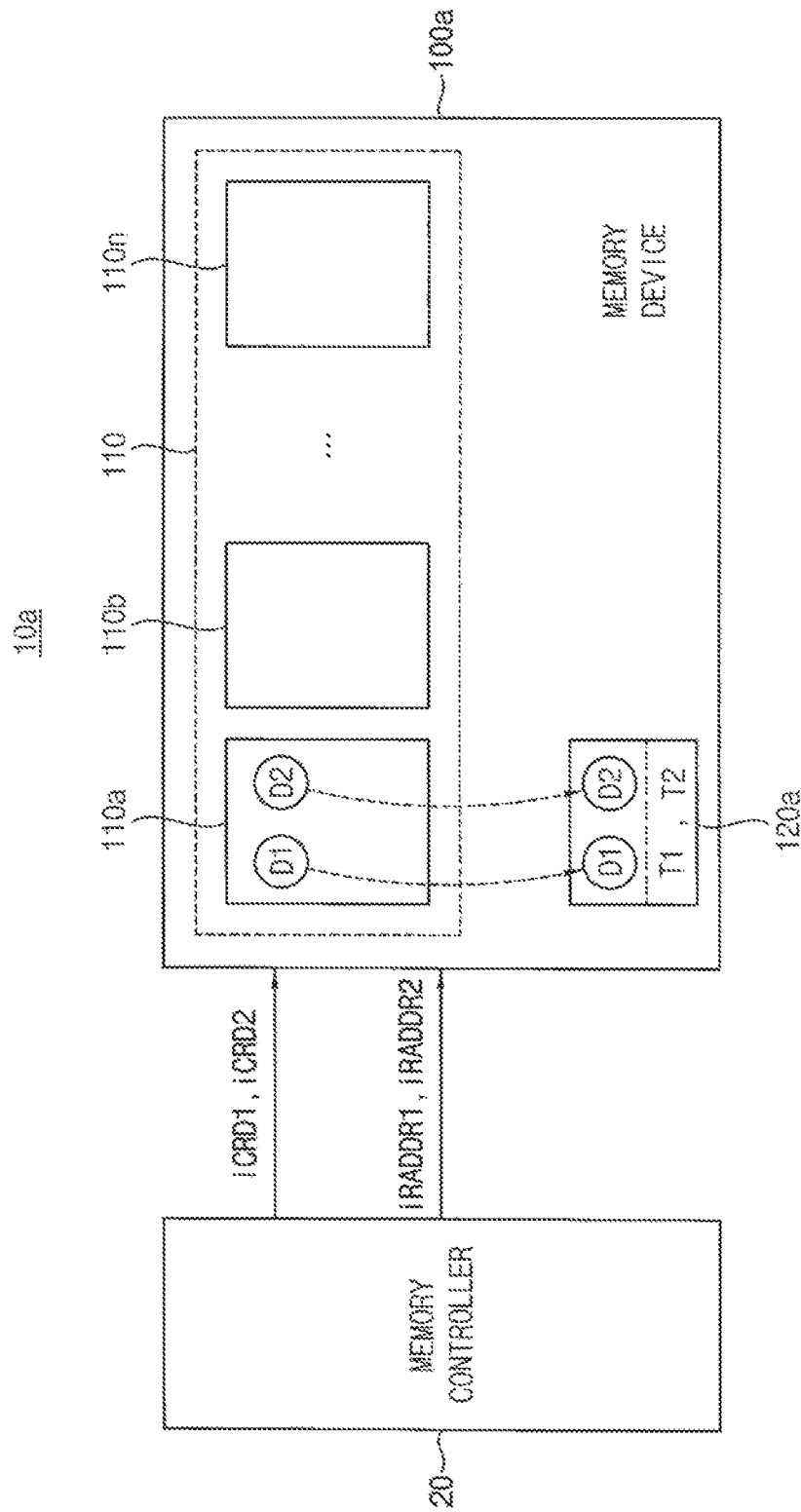
FIG. 9 is a diagram for describing an operation of the exemplary memory system and the semiconductor memory device of FIG. 8.

FIG. 9 is a diagram for describing an operation of the memory system and the semiconductor memory device of FIG. 8.

Referring to FIGS. 8 and 9, the memory controller 20 may generate the first read command iCRD1, the first read address iRADDR1, a third read command iCRD2 and a third read address iRADDR2, and may provide the first read command iCRD1, the first read address iRADDR1, the third read command iCRD2 and the third read address iRADDR2 to the semiconductor memory device 100a.

Each of the first and third read commands iCRD1 and iCRD2 may be a command for performing the internal read operation. Each of the first and third read addresses iRADDR1 and iRADDR2 may indicate a respective one of the first and second read regions of the memory cell array 110 in which the first and second data D1 and D2 to be read are stored.

The semiconductor memory device 100a may receive the first read command iCRD1, the first read address iRADDR1, the third read command iCRD2 and the third read address iRADDR2.

The semiconductor memory device 100a may substantially simultaneously (or concurrently) or sequentially perform the first internal read operation and a second internal read operation. For example, based on the first read command iCRD1 and the first read address iRADDR1, the first data D1 may be retrieved from the first read region, and the retrieved first data D1 may be stored into the first buffer 120a. In addition, based on the third read command iCRD2 and the third read address iRADDR2, the second data D2 may be retrieved from the second read region, and the retrieved second data D2 may be stored into the first buffer 120a.

In some example embodiments, each of the size of the first data D1 and a size of the second data D2 may be smaller than the storage capacity of the first buffer 120a. For example, the storage capacity of the first buffer 120a may be greater than a unit of which the semiconductor memory device 100a performs the read operation. For example, a plurality of (e.g., at least two of) the internal read operations may be substantially simultaneously or sequentially performed, and then a plurality of data (e.g., the data D1 and D2) may be substantially simultaneously or sequentially stored into the first buffer 120a, such that they are retained concurrently in the first buffer 120a.

In some example embodiments, the first buffer 120a may further store first tag information T1 for identifying the first data D1 and second tag information T2 for identifying the second data D2. The tag information T1 and T2 may be used for identifying the data D1 and D2 in the internal write operations, the buffer read operations, etc., after the internal read operations. For example, the tag information T1 and T2 may be used in subsequent operations to identify the data D1 and D2.

Figure 10:
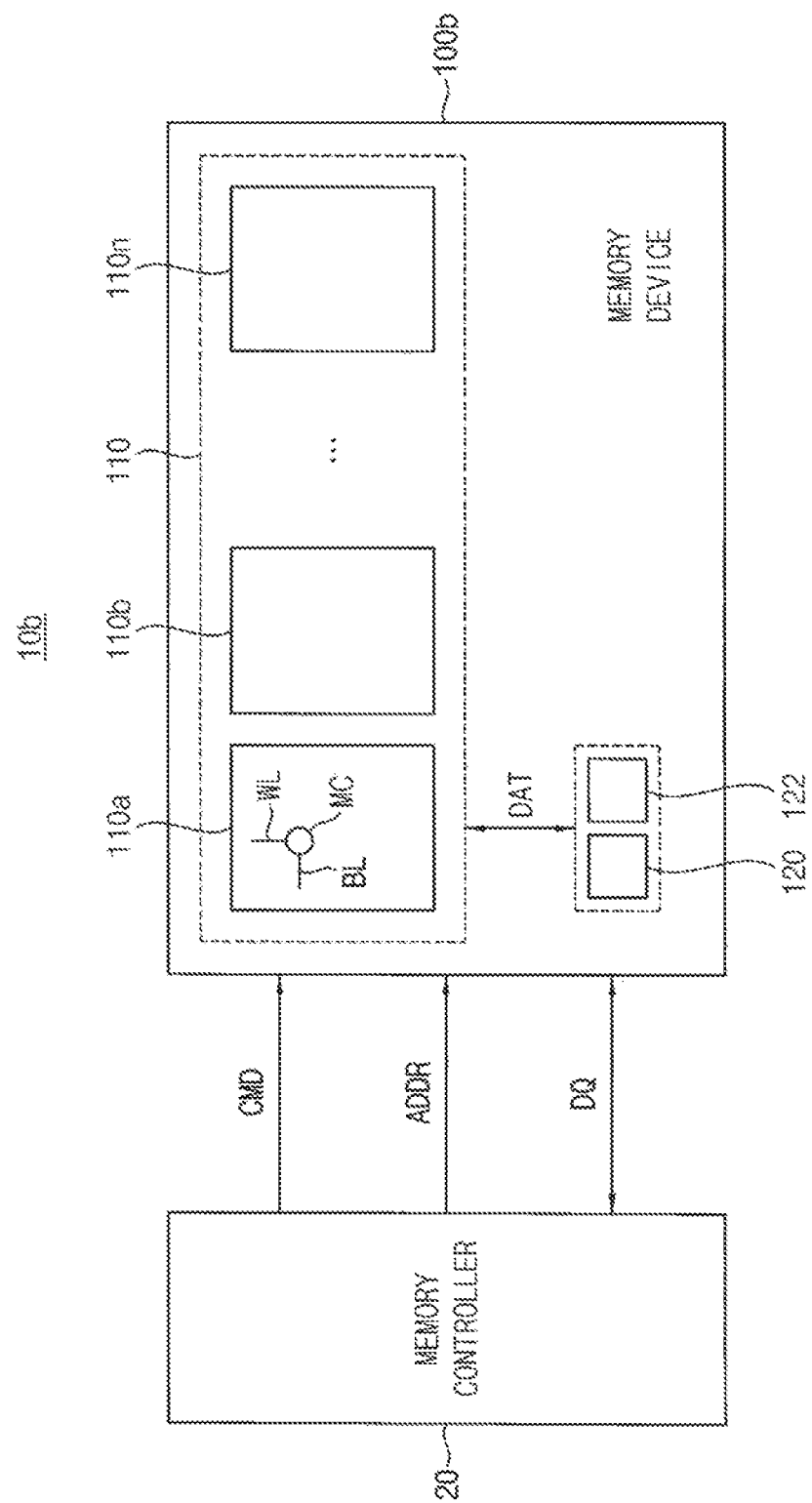
FIG. 10 is a block diagram illustrating a memory system including a semiconductor memory device according to example embodiments.
Figure 11:
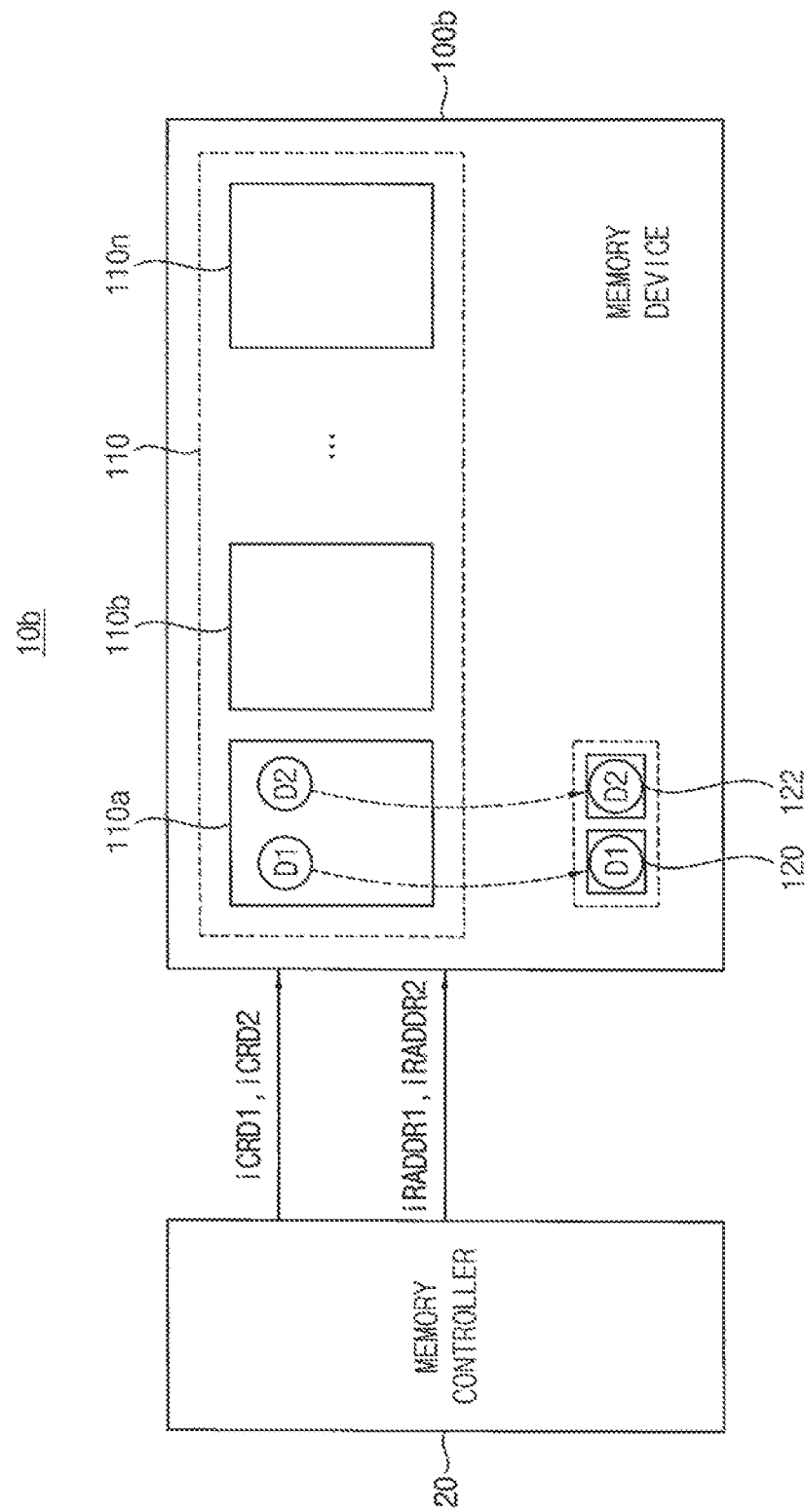
FIG. 11 is a diagram for describing an operation of the exemplary memory system and the semiconductor memory device of FIG. 10.

FIG. 10 is a block diagram illustrating a memory system including a semiconductor memory device according to example embodiments. FIG. 11 is a diagram for describing an operation of the memory system and the semiconductor memory device of FIG. 10.

Referring to FIG. 10, a memory system 10b includes a memory controller 20 and a semiconductor memory device 100b. The semiconductor memory device 100b includes a memory cell array 110, a first buffer 120, and a second buffer 122. The semiconductor memory device 100b in FIG. 10 may be substantially the same as the semiconductor memory device 100 in FIG. 1, except that the semiconductor memory device 100b in FIG. 10 further includes the second buffer 122. As shown in FIG. 10, each memory cell MC may be connected to one word line WL and one bit line BL.

Referring to FIGS. 10 and 11, the memory controller 20 may generate the first read command iCRD1, the first read address iRADDR1, the third read command iCRD2 and the third read address iRADDR2, and may provide the first read command iCRD1, the first read address iRADDR1, the third read command iCRD2 and the third read address iRADDR2 to the semiconductor memory device 100b.

The first read command iCRD1, the first read address iRADDR1, the third read command iCRD2 and the third read address iRADDR2 in FIG. 11 may be substantially the same as the respective first read command iCRD1, the first read address iRADDR1, the third read command iCRD2 and the third read address iRADDR2 in FIG. 9.

The semiconductor memory device 100b may receive the first read command iCRD1, the first read address iRADDR1, the third read command iCRD2 and the third read address iRADDR2.

The semiconductor memory device 100b may substantially simultaneously (or concurrently) or sequentially perform the first internal read operation and the second internal read operation. For example, based on the first read command iCRD1 and the first read address iRADDR1, the first data D1 may be retrieved from the first read region, and the retrieved first data D1 may be stored into the first buffer 120. In addition, based on the third read command iCRD2 and the third read address iRADDR2, the second data D2 may be retrieved from the second read region, and the retrieved second data D2 may be stored into the second buffer 122.

According to example embodiments, each of the size of the first data D1 and the size of the second data D2 may be substantially the same as or smaller than a respective one of the storage capacity of the first buffer 120 and a storage capacity of the second buffer 122.

Although not illustrated in FIG. 11, the first buffer 120 may further store the first tag information T1 for identifying the first data D1, and the second buffer 122 may further store the second tag information T2 for identifying the second data D2.

Although not illustrated in FIGS. 9 and 11, each of the semiconductor memory device 100a in FIG. 8 and the semiconductor memory device 100b in FIG. 10 may further: perform the internal write operations described with reference to FIGS. 3A, 3B and 3C after the internal read operations; perform the buffer read operations or the buffer write operations described with reference to FIGS. 4 and 5 after the internal read operations; and/or perform the normal read operation or the normal write operation described with reference to FIGS. 6 and 7 while the internal read operations are performed.

Figure 12:
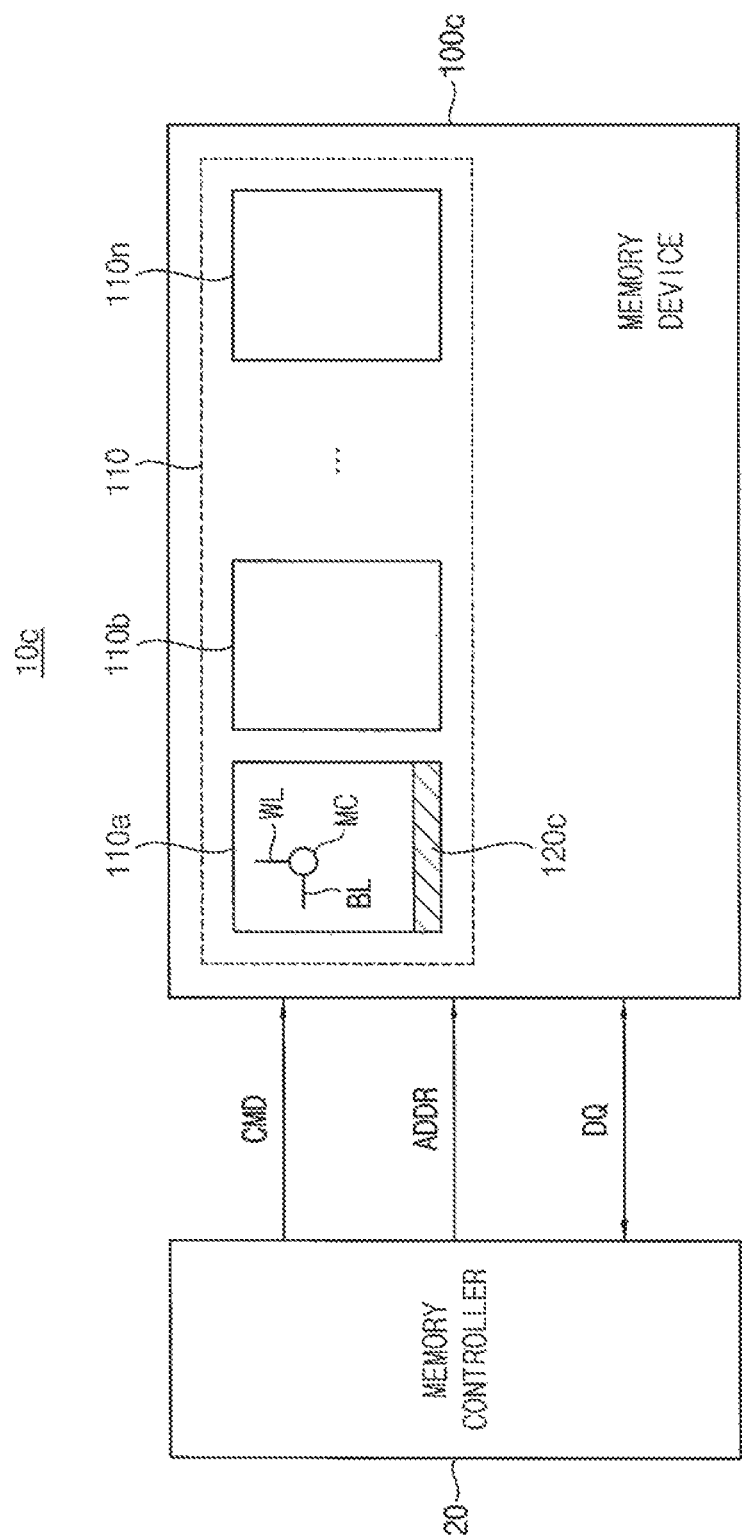
FIG. 12 is a block diagram illustrating a memory system including a semiconductor memory device according to example embodiments.

FIG. 12 is a block diagram illustrating a memory system including a semiconductor memory device according to example embodiments.

Referring to FIG. 12, a memory system 10c includes a memory controller 20 and a semiconductor memory device 100c. The semiconductor memory device 100c includes a memory cell array 110 and a first buffer 120c. The memory cell array 110 includes a plurality of bank arrays 110a, 110b, 110n. As shown in FIG. 12, each memory cell MC may be connected to one word line WL and one bit line BL.

The semiconductor memory device 100 in FIG. 12 may be substantially the same as the semiconductor memory device 100 in FIG. 1, except that the first buffer 120c in FIG. 12 is included in the memory cell array 110.

In some example embodiments, the first buffer 120c may be a portion of the memory cell array 110. For example, each of the bank arrays 110a-110n may include a repair region that includes at least one repair cell and/or at least one repair row for a repair operation, and then a portion of the repair region of the first bank array 110a may be used as the first buffer 120c.

Figure 13:
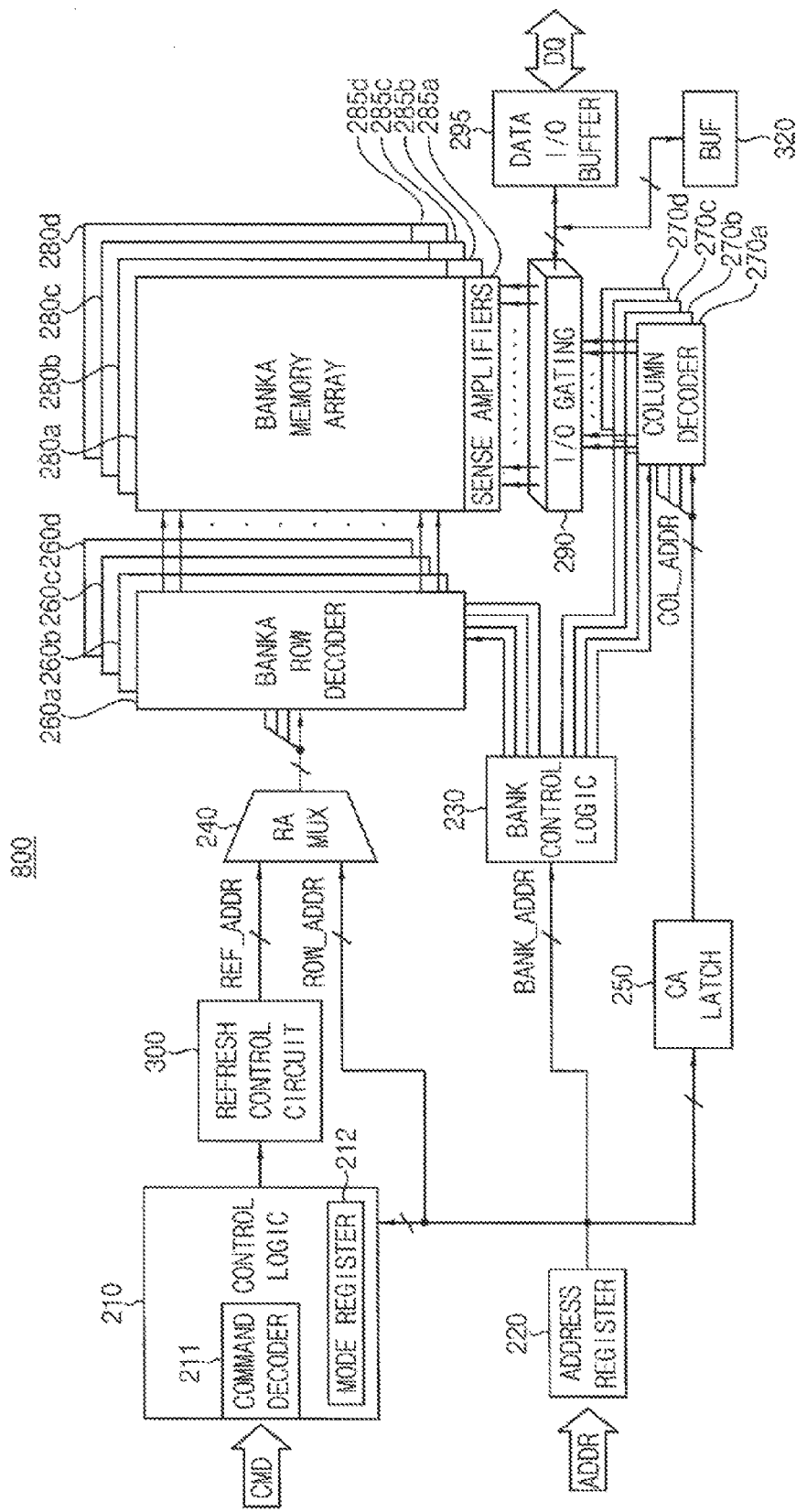
FIG. 13 is a block diagram illustrating a semiconductor memory device according to example embodiments.

FIG. 13 is a block diagram illustrating a semiconductor memory device according to example embodiments.

Referring to FIG. 13, a semiconductor memory device 800 includes a control logic 210, an address register 220, a bank control logic 230, a row address multiplexer 240, a column address latch 250, a row decoder, a column decoder, a memory cell array, a sense amplifier unit, an I/O gating circuit 290, a data I/O buffer 295, a refresh control circuit 300 and a first buffer 320.

The memory cell array may include a plurality of bank arrays, e.g., first through fourth bank arrays 280a, 280b, 280c and 280d. The row decoder may include a plurality of bank row decoders, e.g., first through fourth bank row decoders 260a, 260b, 260c, and 260d connected to the first through fourth bank arrays 280a, 280b, 280c, and 280d, respectively. The column decoder may include a plurality of bank column decoders, e.g., first through fourth bank column decoders 270a, 270b, 270c and 270d connected to the first through fourth bank arrays 280a, 280b, 280c, and 280d, respectively. The sense amplifier unit may include a plurality of bank sense amplifiers, e.g., first through fourth bank sense amplifiers 285a, 285b, 285c and 285d connected to the first through fourth bank arrays 280a, 285b, 280c, and 280d, respectively. The first through fourth bank arrays 280a~280d, the first through fourth bank row decoders 260a~260d, the first through fourth bank column decoders 270a~270d, and the first through fourth bank sense amplifiers 285a~285d may form first through fourth banks, respectively. For example, the first bank array 280a, the first bank row decoder 260a, the first bank column decoder 270a, and the first bank sense amplifier 285a may form the first bank; the second bank array 280b, the second bank row decoder 260b, the second bank column decoder 270b, and the second bank sense amplifier 285b may form the second bank; the third bank array 280c, the third bank row decoder 260c, the third bank column decoder 270c, and the third bank sense amplifier 285c may form the third bank; and the fourth bank array 280d, the fourth bank row decoder 260d, the fourth bank column decoder 270d, and the fourth bank sense amplifier 285d may form the fourth bank. Although FIG. 13 illustrates the semiconductor memory device 800 including four banks, in other example embodiments, the semiconductor memory device 800 may include any number of banks.

In some example embodiments, the semiconductor memory device 800 may be a DRAM, such as a double data rate (DDR) synchronous DRAM (SDRAM), a low power DDR (LPDDR) SDRAM, a graphics double data rate (GDDR) SDRAM, a Rambus DRAM (RDRAM), etc., or may be other types of semiconductor memory devices that operate based on the deterministic interface.

The address register 220 may receive an address ADDR including a bank address BANK_ADDR, a row address ROW_ADDR and a column address COL_ADDR from a memory controller (not illustrated). The address register 220 may provide the received bank address BANK_ADDR to the bank control logic circuit 230, may provide the received row address ROW_ADDR to the row address multiplexer 240, and may provide the received column address COL_ADDR to the column address latch 250.

The bank control logic circuit 230 may generate bank control signals in response to receipt of the bank address BANK_ADDR. One of the first through fourth bank row decoders 260a~260d corresponding to the received bank address BANK_ADDR may be activated in response to the bank control signals generated by the bank control logic circuit 230, and one of the first through fourth bank column decoders 270a~270d corresponding to the received bank address BANK_ADDR may be activated in response to the bank control signals generated by the bank control logic circuit 230.

The row address multiplexer 240 may receive the row address ROW_ADDR from the address register 220, and may receive a refresh address REF_ADDR from the refresh control circuit 300. The row address multiplexer 240 may selectively output the row address ROW_ADDR or the refresh address REF_ADDR. A row address output from the row address multiplexer 240 (e.g., the row address ROW_ADDR or the refresh address REF_ADDR) may be applied to the first through fourth bank row decoders 260a~260d.

The activated one of the first through fourth bank row decoders 260a~260d may decode the row address output from the row address multiplexer 240, and may activate a wordline corresponding to the row address. For example, the activated bank row decoder may apply a wordline driving voltage to the wordline corresponding to the row address.

The column address latch 250 may receive the column address COL_ADDR from the address register 220, and may temporarily store the received column address COL_ADDR. The column address latch 250 may apply the temporarily stored or received column address COL_ADDR to the first through fourth bank column decoders 270a~270d.

The activated one of the first through fourth bank column decoders 270a~270d may decode the column address COL_ADDR output from the column address latch 250, and may control the I/O gating circuit 290 to output data corresponding to the column address COL_ADDR.

The I/O gating circuit 290 may include a circuitry for gating I/O data. For example, although not shown, the I/O gating circuit 290 may further include an input data mask logic, read data latches for storing data output from the first through fourth bank arrays 280a~280d, and write drivers for writing data to the first through fourth bank arrays 280a~280d.

Data to be read from one of the first through fourth bank arrays 280a~280d may be sensed by a sense amplifier coupled to the one bank array, and may be stored in the read data latches. The data stored in the read data latches may be provided to the memory controller via the data I/O buffer 295 and data bus/data terminals DQ. Data received via data terminals/data bus DQ to be written to one of the first through fourth bank arrays 280a~280d may be provided from the memory controller to the data I/O buffer 295. The data received via data terminals/data bus DQ provided to the data I/O buffer 295 may be written to the one bank array via the write drivers.

The control logic 210 may control an operation of the semiconductor memory device 800. For example, the control logic 210 may generate control signals for the semiconductor memory device 800 to perform a write operation or a read operation. The control logic 210 may include a command decoder 211 that decodes a command CMD received from the memory controller and a mode register 212 that sets an operation mode of the semiconductor memory device 800. For example, the command decoder 211 may generate the control signals corresponding to the command CMD by decoding a write enable signal (e.g., /WE), a row address strobe signal (e.g., /RAS), a column address strobe signal (e.g., /CAS), a chip select signal (e.g., /CS), etc. The command decoder 211 may further receive a clock signal (e.g., CLK) and a clock enable signal (e.g., /CKE) for operating the semiconductor memory device 800 in a synchronous manner.

The refresh control circuit 300 may generate the refresh address REF_ADDR to be provided to the row address multiplexer 240 based on the control of the control logic 210. The refresh operation may be performed on a plurality of memory cells included in the memory cell array based on the refresh address REF_ADDR.

The first buffer 320 may be different and separated from the data I/O buffer 295. For example, the first buffer 320 may be physically separate from the I/O buffer 295. The semiconductor memory device 800 according to example embodiments may perform at least one of the internal read operation and the internal write operation based on the first buffer 320. Accordingly, the semiconductor memory device 800 may efficiently perform the internal copy operation, and thus may operate with relatively low power consumption, improved bus efficiency and enhanced performance.

FIGS. 14, 15, 16 and 17 are flow charts illustrating a method of operating the semiconductor memory device according to example embodiments.

Figure 14:
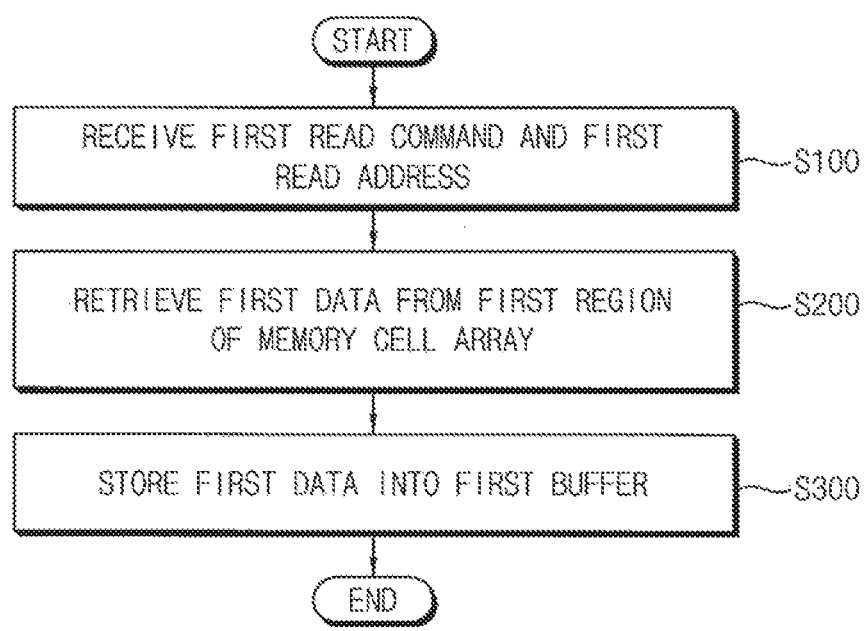
FIGS. 14, 15, 16 and 17 are flow charts illustrating a method of operating the semiconductor memory device according to example embodiments.

Referring to FIGS. 2 and 14, the semiconductor memory device 100 receives the first read command iCRD1 and the first read address iRADDR1 from the memory controller 20 (operation S100). Based on the first read command iCRD1 and the first read address iRADDR1, the semiconductor memory device 100 retrieves the first data D1 from the first read region of the memory cell array 110 (operation S200), and stores the first data D1 into the first buffer 120 (operation S300). The semiconductor memory device 100 may perform the internal read operation, which is different from the normal read operation, using the first buffer 120.

Figure 15:
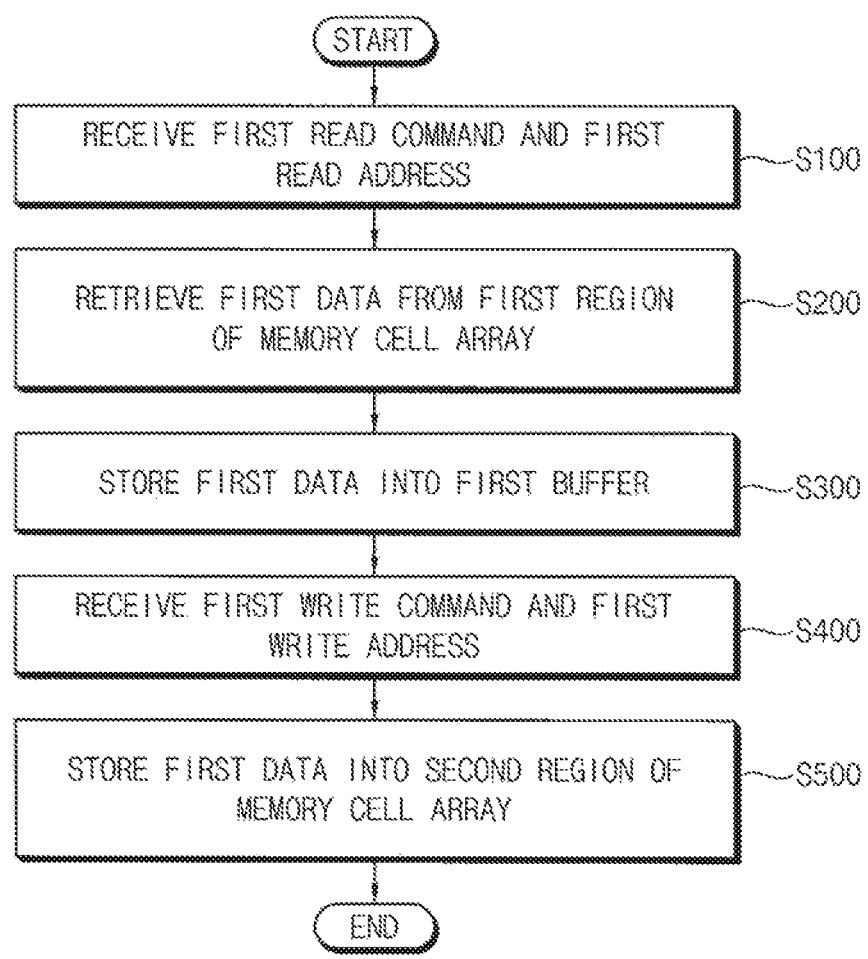

Referring to FIGS. 2, 3A and 15, operations S100, S200 and S300 in FIG. 15 may be substantially the same as the respective operations S100, S200 and S300 in FIG. 14. After the internal read operation, the semiconductor memory device 100 may receive the first write command iCWR1 and the first write address iWADDR11 from the memory controller 20 (operation S400). Based on the first write command iCWR1 and the first write address iWADDR11, the semiconductor memory device 100 may store the first data D1 that is retrieved from the first buffer 120 into the first write region of the memory cell array 110 (operation S500). The semiconductor memory device 100 may efficiently perform the copy operation based on the internal read operation and the internal write operation, without outputting/receiving the data that is read or written to/from the memory controller 20.

Figure 16:
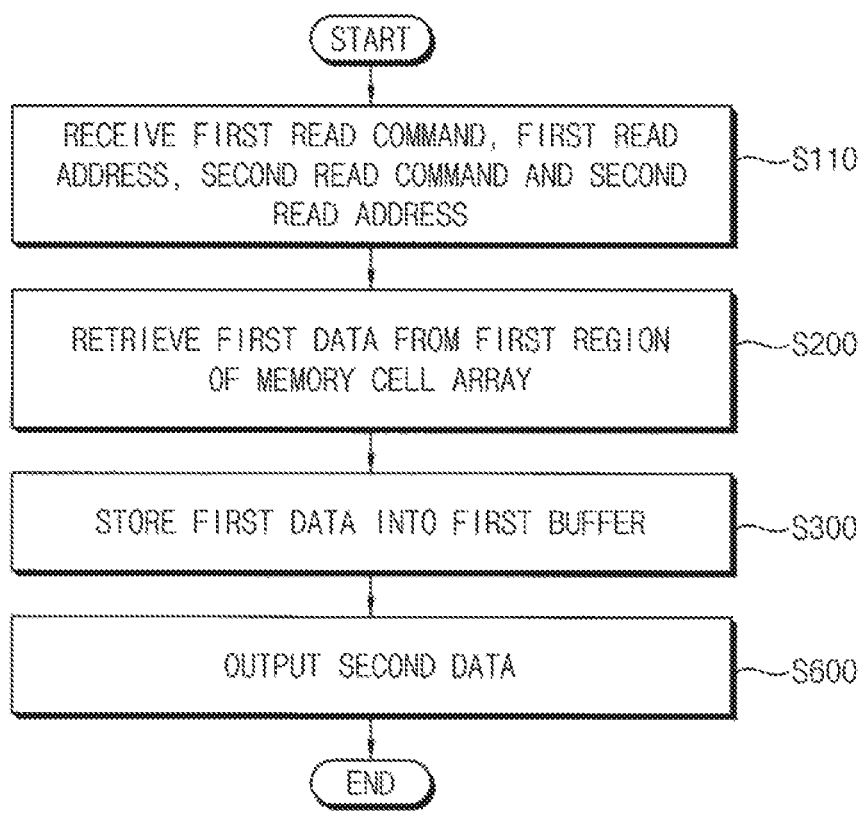

Referring to FIGS. 6 and 16, the semiconductor memory device 100 receives the first read command iCRD1 and the first read address iRADDR1 from the memory controller 20, and may further receive the second read command CRD1 and the second read address RADDR1 from the memory controller 20 (operation 5110). Operations S200 and S300 in FIG. 16 may be substantially the same as the respective operations S200 and S300 in FIG. 14. While the internal read operation is performed, based on the second read command CRD1 and the second read address RADDR1, the semiconductor memory device 100 may output the data RDAT1 that is retrieved from the memory cell array 110 to the memory controller 20 (operation S600). The semiconductor memory device 100 may substantially simultaneously (or concurrently) perform the internal read operation and the normal read operation. For example, the internal read operation and the normal read operation may be performed or processed in parallel.

Figure 17:
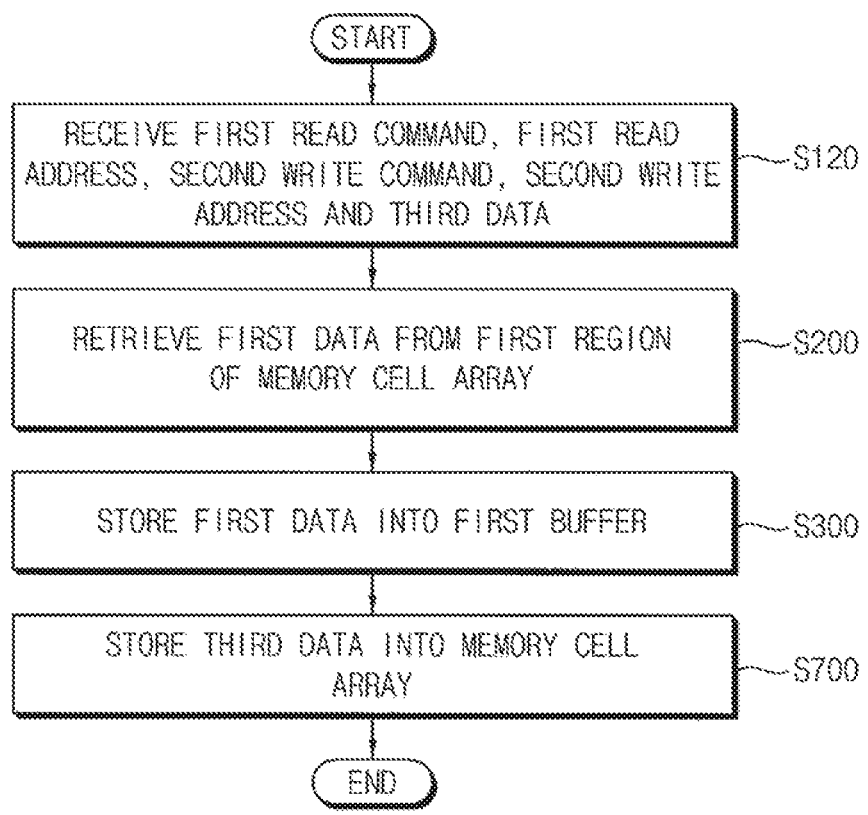

Referring to FIGS. 7 and 17, the semiconductor memory device 100 receives the first read command iCRD1 and the first read address iRADDR1 from the memory controller 20, and may further receive the second write command CWR1, the second write address WADDR1 and the data WDAT1 from the memory controller 20 (operation S120). Operations S200 and S300 in FIG. 17 may be substantially the same as the operations S200 and S300 in FIG. 14, respectively. While the internal read operation is performed, based on the second write command CWR1 and the second write address WADDR1, the semiconductor memory device 100 may store the data WDAT1 that is received from the memory controller 20 into the memory cell array 110 (operation S700). The semiconductor memory device 100 may substantially simultaneously (e.g., in parallel) perform the internal read operation and the normal write operation.

Figure 18:
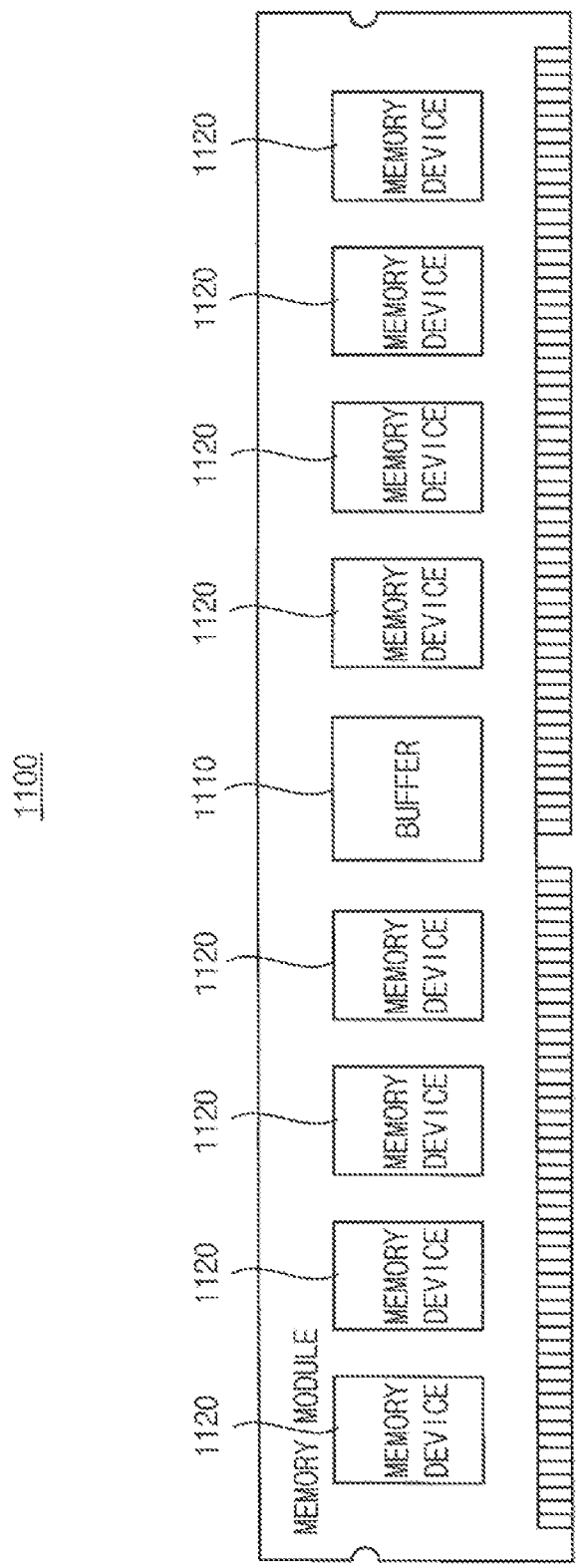
FIG. 18 is a block diagram illustrating a memory module including the semiconductor memory device according to example embodiments.

FIG. 18 is a block diagram illustrating a memory module including the semiconductor memory device according to example embodiments.

Referring to FIG. 18, a memory module 1100 may include a plurality of semiconductor memory devices 1120. In some example embodiments, the memory module 1100 may be an unbuffered dual in-line memory module (UDIMM), a registered dual in-line memory module (RDIMM), a fully buffered dual in-line memory module (FBDIMM), a load reduced dual in-line memory module (LRDIMM), etc.

The memory module 1100 may further include a buffer 1110. The buffer 1110 may receive a command signal, an address signal and/or data from a memory controller (not illustrated) through a plurality of transmission lines, and may provide the command signal, the address signal and/or the data to the plurality of semiconductor memory devices 1120 by buffering the command signal, the address signal and/or the data.

In some example embodiments, data transmission lines between the buffer 1110 and the semiconductor memory devices 1120 may be connected in a point-to-point topology. In some example embodiments, command/address transmission lines between the buffer 1110 and the semiconductor memory devices 1120 may be connected in a multi-drop topology, a daisy-chain topology, a fly-by daisy-chain topology, or the like. Since the buffer 1110 buffers all of the command signal, the address signal and the data, the memory controller may interface with the memory module 1100 by driving only a load of the buffer 1110. Accordingly, the memory module 1100 may include more semiconductor memory devices 1120 and/or more memory ranks, and a memory system may include more memory modules.

Each of the semiconductor memory devices 1120 may be one of the semiconductor memory devices 100 in FIG. 1, the semiconductor memory devices 100a of FIG. 8, the semiconductor memory devices 100b in FIG. 10, the semiconductor memory devices 100c of FIG. 12 and the semiconductor memory devices 800 of FIG. 13. Each of the semiconductor memory devices 1120 may include at least one buffer that is different and separated from the data I/O buffer (e.g., buffer 1110). The semiconductor memory devices 1120 may perform at least one of the internal read operation and the internal write operation based on the at least one buffer, and thus the semiconductor memory devices 1120 may efficiently perform the copy operation based on the internal read operation and the internal write operation. Accordingly, the semiconductor memory devices 1120 and the memory module 1100 may operate with relatively low power consumption, improved bus efficiency and enhanced performance.

Figure 19:
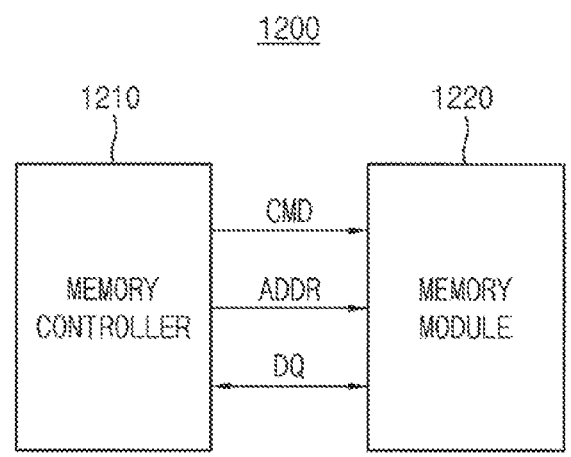
FIG. 19 is a block diagram illustrating a memory system including the semiconductor memory device according to example embodiments.

FIG. 19 is a block diagram illustrating a memory system including the semiconductor memory device according to example embodiments.

Referring to FIG. 19, a memory system 1200 may include a memory controller 1210 and a memory module 1220.

The memory controller 1210 may transmit a command signal CMD to the memory module 1220 via a command transmission line, may transmit an address signal ADDR to the memory module 1220 via an address transmission line, and may exchange data with the memory module 1220 via one or more data transmission lines DQ. The memory controller 1210 may input data to the memory module 1220 or may receive data output from the memory module 1220 based on a request from a host (not illustrated).

The memory module 1220 may be the memory module 1100 of FIG. 18 and may include a plurality of semiconductor memory devices. Each of the plurality of semiconductor memory devices may include at least one buffer that is different and separated from the data I/O buffer. The semiconductor memory devices may perform at least one of the internal read operation and the internal write operation based on the at least one buffer, and thus the semiconductor memory devices may efficiently perform the copy operation based on the internal read operation and the internal write operation. Accordingly, the semiconductor memory devices, the memory module 1220 and the memory system 1200 may operate with relatively low power consumption, improved bus efficiency and enhanced performance.

Figure 20:
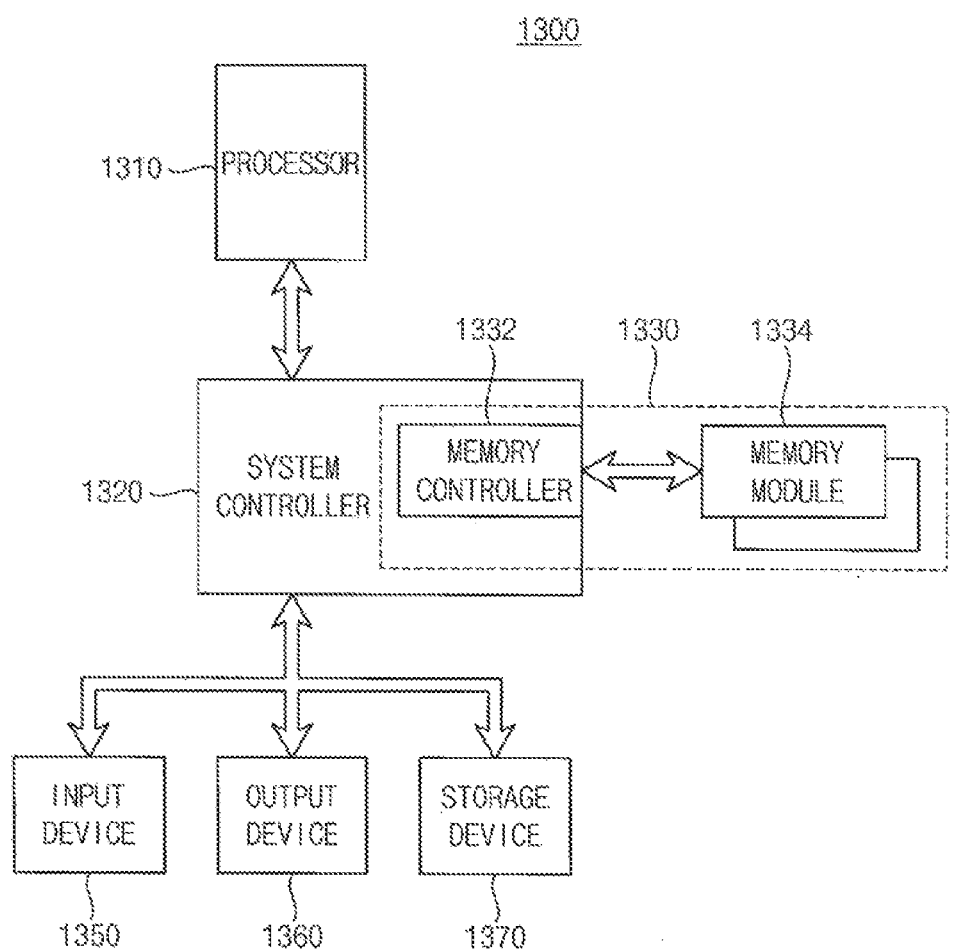
FIG. 20 is a block diagram illustrating a computing system including the semiconductor memory device according to example embodiments.

FIG. 20 is a block diagram illustrating a computing system including the semiconductor memory device according to example embodiments.

Referring to FIG. 20, a computing system 1300 may include a processor 1310, a system controller 1320 and a memory system 1330. The computing system 1300 may further include an input device 1350, an output device 1360 and a storage device 1370.

The memory system 1330 may include a plurality of memory modules 1334, and a memory controller 1332 for controlling the memory modules 1334. The memory modules 1334 may include a plurality of semiconductor memory devices. For example, each of the memory modules 1334 may include a plurality of semiconductor memory devices (e.g., semiconductor memory devices 100). The memory controller 1332 may be included in the system controller 1320. Each of the memory modules 1334 may be the memory module 1100 of FIG. 18 and may include a plurality of semiconductor memory device. The semiconductor memory devices may perform at least one of the internal read operation and the internal write operation based on the at least one buffer, and thus the semiconductor memory devices may efficiently perform the copy operation based on the internal read operation and the internal write operation. Accordingly, the semiconductor memory devices, the memory modules 1334, the memory system 1330 and the computing system 1300 may operate with relatively low power consumption, improved bus efficiency and enhanced performance.

The processor 1310 may perform various computing functions, such as executing specific software instructions for performing specific calculations or tasks. The processor 1310 may be connected to the system controller 1320 via a processor bus. The system controller 1320 may be connected to the input device 1350, the output device 1360 and the storage device 1370 via an expansion bus. As such, the processor 1310 may control the input device 1350, the output device 1360 and the storage device 1370 using the system controller 1320. For example, the input device 1350 may be any input device such as a keypad, a button, a microphone, a touch screen, etc., and the output device 1360 may be any output device such as a speaker, a display device, etc.

In some example embodiment, the computing system 1300 may be any mobile system, such as a mobile phone, a smart phone, a tablet computer, a laptop computer, a personal digital assistants (PDA), a portable multimedia player (PMP), a digital camera, a portable game console, a music player, a camcorder, a video player, a navigation system, etc. The mobile system may further include a wearable device, an internet of things (IoT) device, an internet of everything (IoE) device, an e-book, a virtual reality (VR) device, a robotic device, etc.

In some example embodiment, the computing system 1300 may be any computing system, such as a personal computer (PC), a server computer, a workstation, a tablet computer, a laptop computer, a mobile phone, a smart phone, a PDA, a PMP, a digital camera, a digital television, a set-top box, a music player, a portable game console, a navigation device, etc.

The present disclosure may be used in a semiconductor memory device or system including the semiconductor memory device, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor memory device comprising:
a memory cell array including a plurality of bank arrays, each of the plurality of bank arrays including a plurality of memory cells; and
a first internal buffer,
wherein the memory cell array and the first internal buffer are configured to perform a first internal read operation, including retrieving first data from a first region of the memory cell array and storing the first data into the first internal buffer based on a first read command and a first read address received by the semiconductor memory device, and
wherein the first internal read operation is performed such that no acknowledgement signal is output from the semiconductor memory device in response to the first read command after the storing of the first data into the first internal buffer is completed, and
wherein the first internal read operation is performed without outputting the first data from the semiconductor memory device.

2. The semiconductor memory device of claim 1, wherein the memory cell array and the first internal buffer are configured to perform a first internal write operation, including retrieving the first data from the first internal buffer and storing the first data into a second region of the memory cell array based on a first write command and a first write address received by the semiconductor memory device,
wherein the second region is different from the first region, and
wherein the first internal write operation is performed based on a deterministic interface such that the first data is stored into the second region within a predetermined time period after the first write command is received by the semiconductor memory device and a second acknowledgement signal is not generated after the storing of the first data into the second region is completed.

3. The semiconductor memory device of claim 2, wherein the first and second regions are arranged in a first row of a first bank array among the plurality of bank arrays.

4. The semiconductor memory device of claim 2, wherein the first region is arranged in a first row of a first bank array among the plurality of bank arrays, and
wherein the second region is arranged in a second row of the first bank array different from the first row of the first bank array.

5. The semiconductor memory device of claim 2, wherein the first region is arranged in a first bank array among the plurality of bank arrays, and
wherein the second region is arranged in a second bank array among the plurality of bank arrays, the second bank array being different from the first bank array.

6. The semiconductor memory device of claim 2, wherein a third acknowledgement signal is not generated after copying the first data in the first region to the second region is completed.

7. The semiconductor memory device of claim 1, wherein while the first internal read operation is performed, the memory cell array is configured to concurrently perform a first normal read operation based on a second read command and a second read address, or a first normal write operation based on a first write command and a first write address,
wherein the first normal read operation includes retrieving second data from a second region of the memory cell array and outputting the second data to an external device, and
wherein the first normal write operation includes receiving third data from the external device and storing the third data into a third region of the memory cell array.

8. The semiconductor memory device of claim 7, wherein the second read command is different from the first read command.

9. The semiconductor memory device of claim 1, wherein a size of the first data is substantially the same as a storage capacity of the first internal buffer.

10. The semiconductor memory device of claim 1, wherein a size of the first data is smaller than a storage capacity of the first internal buffer.

11. The semiconductor memory device of claim 10, wherein the memory cell array and the first internal buffer are further configured to perform a second internal read operation, including retrieving second data from a second region of the memory cell array and storing the second data into the first internal buffer based on a second read command and a second read address received by the semiconductor memory device, and
wherein the second region is different from the first region.

12. The semiconductor memory device of claim 11, wherein the first internal buffer is further configured to store first tag information for identifying the first data and second tag information for identifying the second data.

13. The semiconductor memory device claim 1, further comprising:
a second internal buffer separate from the first internal buffer,
wherein the memory cell array and the second internal buffer are configured to perform a second internal read operation, including retrieving second data from a second region of the memory cell array and storing the second data into the second internal buffer based on a second read command and a second read address received by the semiconductor memory device, and
wherein the second region is different from the first region.

14. The semiconductor memory device of claim 1, wherein the first internal buffer is a portion of the memory cell array.

15. A memory system comprising:
a memory controller configured to generate a first read command and a first read address; and
a semiconductor memory device controlled by the memory controller, the semiconductor memory device comprising:
a memory cell array including a plurality of bank arrays, each of the plurality of bank arrays including a plurality of memory cells; and
a first internal buffer, wherein the memory cell array and the first internal buffer are configured to perform a first internal read operation, including retrieving first data from a first region of the memory cell array and storing the first data into the first internal buffer, based on the first read command and the first read address, wherein the first internal read operation is performed such that no acknowledgement signal is output from the semiconductor memory device in response to the first read command after the storing the first data into the first internal buffer is completed, and wherein the first internal read operation is performed without outputting the first data from the semiconductor memory device.

16. A semiconductor memory device comprising:

a memory cell array including a plurality of bank arrays, each of the plurality of bank arrays including a plurality of memory cells arranged in rows and columns;

a first input/output buffer configured to receive input data from a memory controller external to the semiconductor memory device and output data to the memory controller; and a first internal buffer, wherein the semiconductor memory device is configured to receive a first command, a first address, a second command, and a second address, wherein the memory cell array and the first internal buffer are configured to perform a first internal read operation based on the first command and the first address received by the semiconductor memory device, including retrieving first data from a first region of the memory cell array and storing the first data into the first internal buffer, wherein the first data is not output from the semiconductor memory device in performing the first internal read operation, wherein the memory cell array and the first input/output buffer are configured to perform a second operation based on the second command and the second address received by the semiconductor memory device concurrently with performing the first internal read operation, and wherein no acknowledgement signal is output from the semiconductor memory device in response to the first command after the storing of the first data into the first internal buffer is completed.

17. The semiconductor memory device of claim 16, wherein the second operation is an access operation in which second data is transmitted between the semiconductor memory device and an external device.

18. The semiconductor memory device of claim 16, wherein the second operation is one of an external read operation that includes retrieving second data from a second region of the memory cell array and outputting the second data to an external device or an external write operation that includes receiving third data from the memory controller and storing the third data in the second region of the semiconductor memory device.

19. The semiconductor memory device claim 18, wherein the first region is arranged in a first bank array among the plurality of bank arrays, and wherein the second region is arranged in a second bank array among the plurality of bank arrays, the second bank array being different from the first bank array.

20. The semiconductor memory device of claim 16, wherein the first internal buffer is further configured to store first tag information for identifying the first data.

* * * * *